(12) United States Patent
Takahashi et al.

(10) Patent No.: US 8,983,016 B2
(45) Date of Patent: Mar. 17, 2015

(54) CIRCUIT, CONTROL SYSTEM, CONTROL METHOD, AND COMPUTER-READABLE RECORDING MEDIUM FOR RECORDING PROGRAM

(75) Inventors: Masayuki Takahashi, Minato-ku (JP); Tomoki Yoshihara, Minato-ku (JP)

(73) Assignee: NEC Corporation, Tokyo (JP)

( * ) Notice: Subject to any disclaimer, the term of this patent is extended or adjusted under 35 U.S.C. 154(b) by 649 days.

(21) Appl. No.: 13/257,772

(22) PCT Filed: Mar. 15, 2010

(86) PCT No.: PCT/JP2010/054746
§ 371 (c)(1),
(2), (4) Date: Sep. 20, 2011

(87) PCT Pub. No.: WO2010/110184
PCT Pub. Date: Sep. 30, 2010

(65) Prior Publication Data
US 2012/0008949 A1    Jan. 12, 2012

(30) Foreign Application Priority Data
Mar. 23, 2009    (JP) .................................. 2009-070347

(51) Int. Cl.
H03B 29/00    (2006.01)
H03L 7/085    (2006.01)
H03L 7/089    (2006.01)
H03D 3/24    (2006.01)
H03L 7/107    (2006.01)
H03L 7/093    (2006.01)

(52) U.S. Cl.
CPC .............. *H03L 7/1075* (2013.01); *H03L 7/093* (2013.01)

USPC .......................................... 375/376; 327/156

(58) Field of Classification Search
CPC ........... H03L 7/085; H03L 7/087; H03L 7/08; H03L 7/081; H03L 7/18; H03L 7/16; H04L 27/2657; H04L 27/2665; H04L 27/2675; H04L 27/2684; H04L 27/2628; H04L 27/265; H04L 1/205; H04L 7/033
USPC ........................... 375/371, 376, 327; 327/156
See application file for complete search history.

(56) References Cited

U.S. PATENT DOCUMENTS

| | | | |
|---|---|---|---|
| 5,557,196 A * | 9/1996 | Ujiie .......................... 324/76.77 |
| 7,167,509 B2 * | 1/2007 | Hasegawa et al. ............ 375/219 |
| 2002/0006167 A1 * | 1/2002 | McFarland .................... 375/260 |
| 2002/0006171 A1 * | 1/2002 | Nielsen ........................ 375/316 |
| 2002/0098795 A1 * | 7/2002 | Brede et al. .................. 455/3.01 |
| 2002/0136330 A1 * | 9/2002 | Taylor et al. .................. 375/327 |

(Continued)

FOREIGN PATENT DOCUMENTS

JP    02-125529 A    5/1990
JP    2000-323982 A    11/2000

(Continued)

*Primary Examiner* — Asad Nawaz
*Assistant Examiner* — Wutchung Chu
(74) *Attorney, Agent, or Firm* — Sughrue Mion, PLLC

(57) ABSTRACT

In order to provide a circuit which can realize high-speed frequency tracking performance while satisfying jitter/wander suppression performance, the circuit controls loop gain of a PLL means, which extracts a clock signal of a SDH signal or an Ethernet signal from an OTN signal, on the basis of a result of processing a jitter/wander component and a frequency change state on the basis of phase comparison data of the PLL means.

22 Claims, 19 Drawing Sheets

(56) References Cited

U.S. PATENT DOCUMENTS

| | | | |
|---|---|---|---|
| 2003/0058952 A1* | 3/2003 | Webster et al. | 375/260 |
| 2003/0091138 A1* | 5/2003 | Tagami | 375/376 |
| 2003/0202573 A1* | 10/2003 | Yamaguchi et al. | 375/226 |
| 2004/0042387 A1* | 3/2004 | Geile | 370/206 |
| 2004/0062278 A1* | 4/2004 | Hadzic et al. | 370/503 |
| 2004/0159541 A1* | 8/2004 | Wang et al. | 204/242 |
| 2005/0022076 A1* | 1/2005 | Nakamura et al. | 714/700 |
| 2005/0046452 A1* | 3/2005 | Briones | 327/156 |
| 2005/0286671 A1 | 12/2005 | Takahashi | |
| 2006/0176994 A1* | 8/2006 | Miller et al. | 375/376 |
| 2006/0193418 A1* | 8/2006 | Fraasch et al. | 375/376 |
| 2006/0269032 A1 | 11/2006 | Takahashi | |
| 2006/0285854 A1* | 12/2006 | Sun et al. | 398/155 |
| 2007/0040615 A1* | 2/2007 | Ammar | 331/2 |
| 2007/0140212 A1* | 6/2007 | Gaikwad et al. | 370/350 |
| 2008/0111633 A1* | 5/2008 | Cranford et al. | 331/10 |
| 2010/0040129 A1* | 2/2010 | Kim et al. | 375/232 |
| 2010/0188158 A1* | 7/2010 | Ainspan et al. | 331/1 A |
| 2010/0211372 A1* | 8/2010 | Troedsson | 703/13 |
| 2010/0214031 A1* | 8/2010 | Yamamoto et al. | 331/34 |

FOREIGN PATENT DOCUMENTS

| | | |
|---|---|---|
| JP | 2006-014010 A | 1/2006 |
| JP | 2006-332964 A | 12/2006 |

* cited by examiner

CIRCUIT, CONTROL SYSTEM, CONTROL METHOD, AND COMPUTER-READABLE RECORDING MEDIUM FOR RECORDING PROGRAM

CROSS REFERENCE TO RELATED APPLICATIONS

This application is a National Stage of International Application No. PCT/JP2010/054746 filed Mar. 15, 2010, claiming priority based on Japanese Patent Application No. 2009-070347 filed Mar. 23, 2009, the contents of all of which are incorporated herein by reference in their entirety.

TECHNICAL FIELD

The present invention relates to a circuit, a control system, a control method and a computer-readable recording medium for recording a program which have a Jitter/Wander suppressing function and a frequency tracking function.

BACKGROUND ART

In the case that a clock signal of a SDH (Synchronous Digital Hierarchy) signal or an Ethernet (registered trademark) signal is extracted from an OTN (Optical Transport Network) signal, a high frequency jitter component and a low frequency wander component are caused by the asynchronous stuff multiplex method.

There are four problems, which will be mentioned later, in the case of suppressing the high frequency jitter and the low frequency wander.

FIG. 1 is a diagram for explaining a first problem which is caused in a PLL (Phase Locked Loop) circuit related to the present invention. The first problem is that jitter/wander (Waiting Time Jitter/Wander) is caused at a time of zero stuff as a fate of the asynchronous stuff multiplex method as shown in FIG. 1.

In FIGS. 1 to 4, OTU (Optical Transport Unit) 3 is an optical interface with a rate of about 40 Gb/s which is specified in OTN. STM (Synchronous Transport Module)-64 and 10 GbE (Gigabit Ethernet) are interfaces with a rate of about 10 Gb/s which are specified by SDH and Ethernet respectively.

According to the stuff multiplex method, it is possible originally to calculate the optimum PLL cut-off frequency through monitoring frequency of the OTN signal, and the SDH signal or the Ethernet signal. However, a high precision oscillator (oven-controlled crystal oscillator) or an external synchronization clock (high precision clock provided by so-called Building Integrated Timing Supply, Synchronization Supply Unit or Clock Supply Module) is necessary for monitoring the frequency. For this reason, system becomes very expensive.

IF the PLL cut-off frequency is made low in order to suppress the jitter/wander at the time of zero stuff, the frequency tracking ability of the PLL circuit declines. In this case, an output wander of the PLL circuit increases.

FIG. 2 is a diagram for explaining a second problem which is caused in the PLL circuit related to the present invention. The second problem is that a link failure may be caused in some cases due to a memory slip of a regenerated signal.

As shown in FIG. 2, a memory for adjusting frequency (memory for switching clock signal) is used in the case of regenerating the SDH signal or the Ethernet signal from the OTN signal. However, if the SDH signal or the Ethernet signal does not follow the OTN signal continuously, the memory slip of the regenerated signal due to memory overflow or memory underflow is caused. As a result, the link failure may be caused finally.

In this case, the second problem may be solved through making a frequency tracking speed high, but jitter/wander suppressing performance is lost instead.

FIG. 3 is a diagram for explaining a third problem which is caused in the PLL circuit related to the present invention. The third problem is that in the case that the SDH signal or the Ethernet signal is transferred through a multistage connection (cascade connection or tandem connection) as shown in FIG. 3, the wander is accumulated, and consequently the memory slip of the regenerated SDH signal or the regenerated Ethernet signal may be caused in some cases.

The wander caused by the multistage connection, which is different from the wander due to the stuff multiplex method described in the first problem, strongly depends on both of a jitter/wander component of PLL and a network wander component.

However, it is necessary to carry out calculation by use of all combinations of a large number of parameters in order to simulate the jitter/wander component of PLL itself and the jitter/wander component of the network wander.

Therefore, it is very difficult to calculate the wander due to the multistage connection beforehand.

FIG. 4 is a diagram for explaining a fourth problem which is caused in the PLL circuit related to the present invention. The fourth problem is that, in the case that a system which has been failed is restored, an output frequency of the restored system becomes abnormal, and consequently output frequencies of all other systems, which are latter part of the multistage connection, may become abnormal one after another with a delay in some cases. As shown in FIG. 4, the fourth problem may be caused in a configuration, similarly to the configuration described in FIG. 3, in which the SDH signal or the Ethernet signal is transferred through the multistage connection. Similarly to the second problem, the fourth problem may be solved through making the frequency tracking speed high, but the jitter/wander suppressing performance is lost instead.

Accordingly, it is necessary to develop a system which can realize the high-speed frequency tracking performance while satisfying the jitter/wander suppressing performance.

As a document related to the present invention, there is a document which discloses an art that only Transient Wander component (jump component of input phase) is detected automatically, and an output phase is adjusted to an input phase preceding the jump (for example, refer to patent document 1).

Moreover, there is another document disclosing an art which can make a phase error small and can suppress the high frequency jitter component and the low frequency wander component simultaneously (for example, refer to patent document 2).

PRIOR ART DOCUMENT

Patent Document

Patent document 1: Japanese Patent Application Laid-Open No. 2006-14010
Patent document 2: Japanese Patent Application Laid-Open No. 2006-332964

DISCLOSURE OF THE INVENTION

Technical Problem

However, both the patent document 1 and the patent document 2 do not include any description on realizing the high-speed frequency tracking performance while satisfying the jitter/wander suppressing performance and do not include any suggestion on necessity of the realization.

An object of the present invention is to provide a circuit, a control system, a control method and a computer-readable recording medium for recording a program which can solve the problem mentioned above.

Technical Solution

In order to achieve the object, the present invention has the following feature.

<Circuit>

A circuit according to the present invention includes a control means to control loop gain of a PLL means, which extracts a clock signal of a SDH signal or an Ethernet signal from an OTN signal, on the basis of a result of processing a jitter/wander component and a frequency change state on the basis of phase comparison data of the PLL means.

<Control System>

A control system according to the present invention controls loop gain of a PLL means, which regenerates a clock signal of a SDH signal or an Ethernet signal from an OTN signal, on the basis of a result of processing a jitter/wander component and a frequency change state on the basis of phase comparison data of the PLL means.

<Control Method>

A control method according to the present invention controls loop gain of a PLL means, which regenerates a clock signal of a SDH signal or an Ethernet signal from an OTN signal, on the basis of a result of processing a jitter/wander component and a frequency change state on the basis of phase comparison data of the PLL means.

<Computer-Readable Recording Medium for Recording Program>

A computer-readable recording medium for recording a program according to the present invention records a program to make a computer execute a process to control loop gain of a PLL means, which regenerates a clock signal of a SDH signal or an Ethernet signal from an OTN signal, on the basis of a result of processing a jitter/wander component and a state of frequency change on the basis of phase comparison data of the PLL means.

Advantageous Effect of the Invention

According to the present invention, it is possible to realize the high-speed frequency tracking performance while satisfying the jitter/wander suppressing performance.

BEST MODE FOR CARRYING OUT THE INVENTION

<Outline of Circuit According to an Exemplary Embodiment of the Present Invention>

A first exemplary embodiment of the present invention is a PLL circuit to which the circuit according to the present invention is applied.

Figure 1:
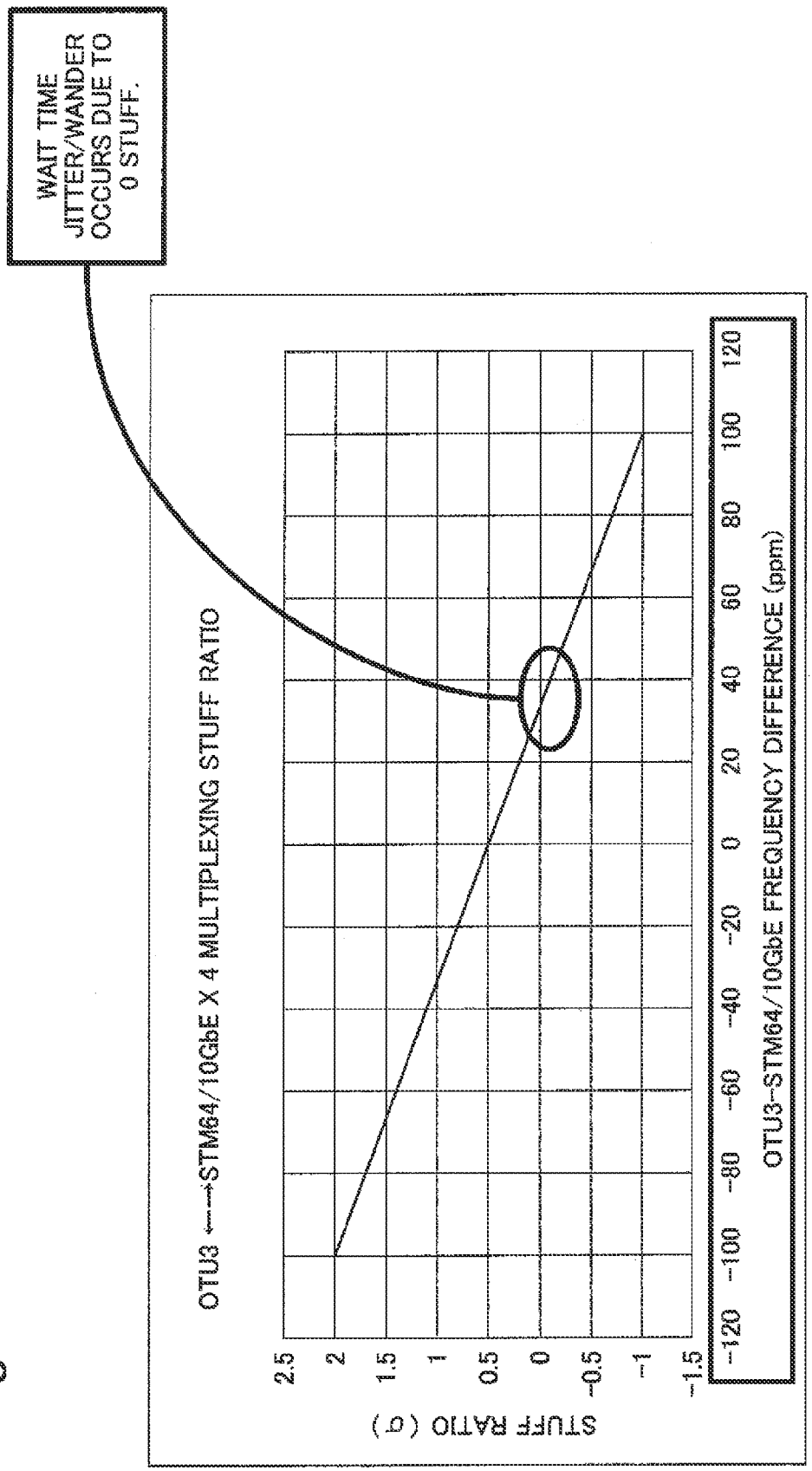
FIG. 1 is a first diagram to explain a problem which is caused in a PLL circuit related to the present invention.
Figure 2:
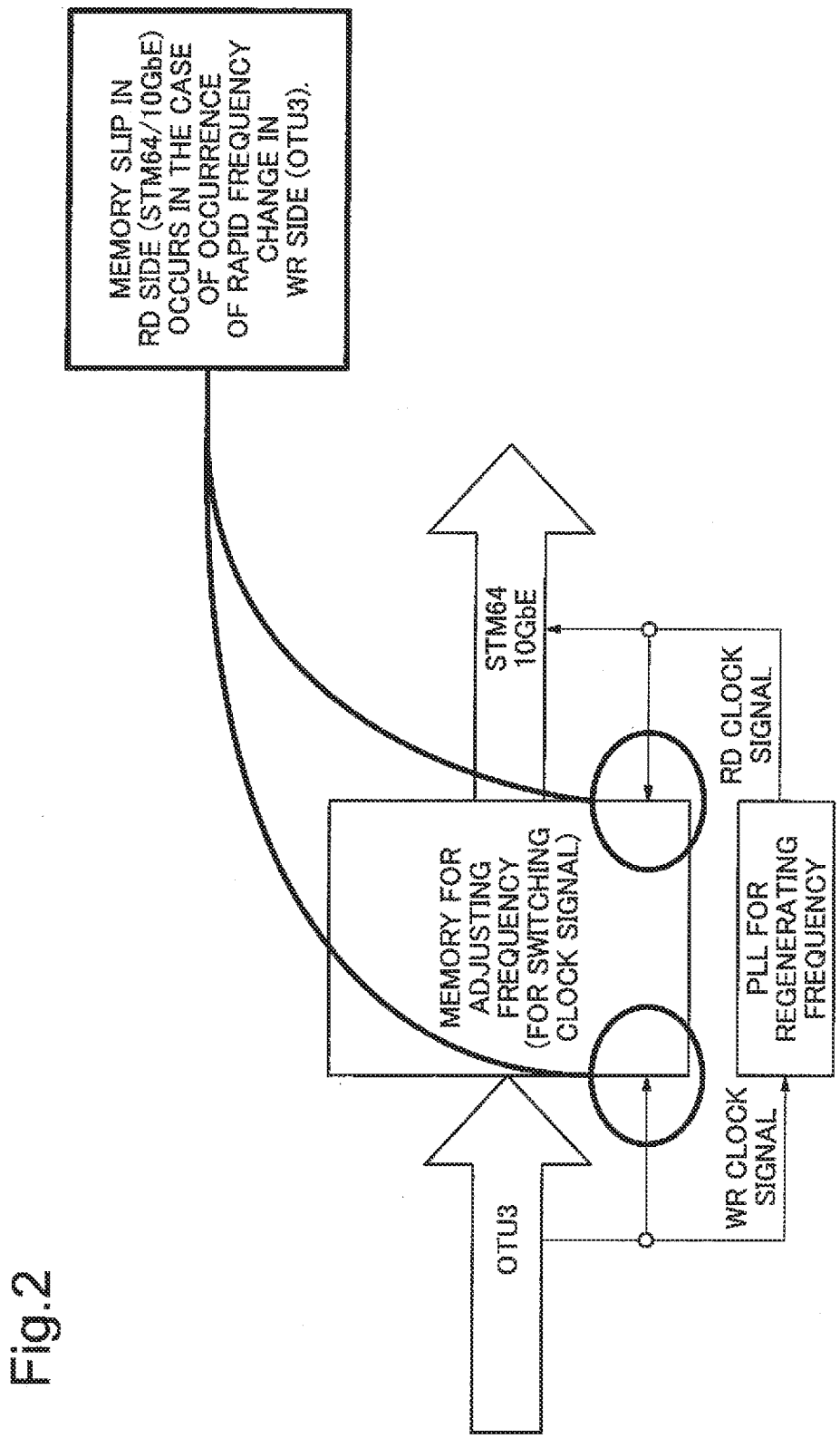
FIG. 2 is a second diagram to explain a problem which is caused in the PLL circuit related to the present invention.
Figure 3:
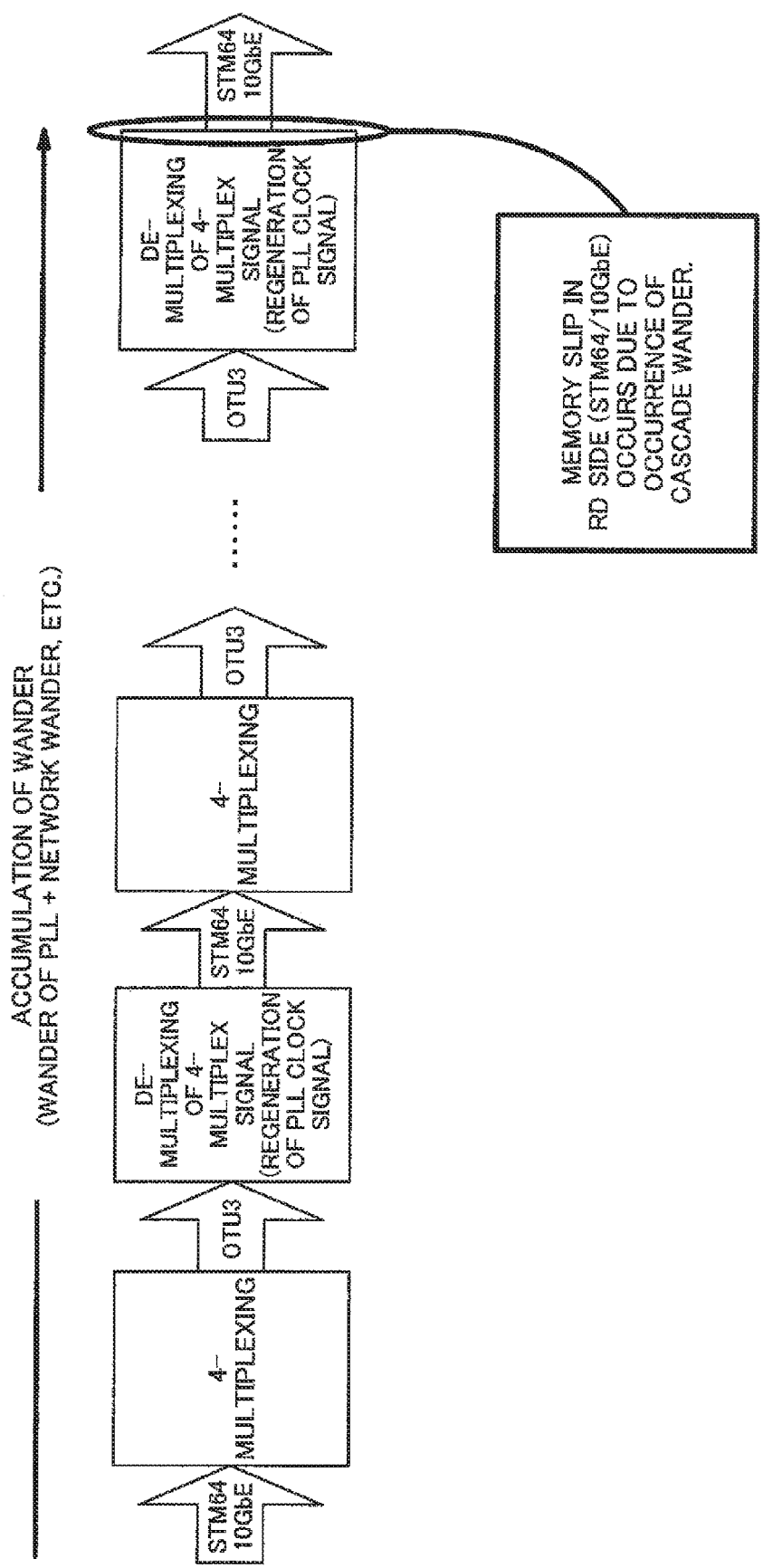
FIG. 3 is a third diagram to explain a problem which is caused in the PLL circuit related to the present invention.
Figure 4:
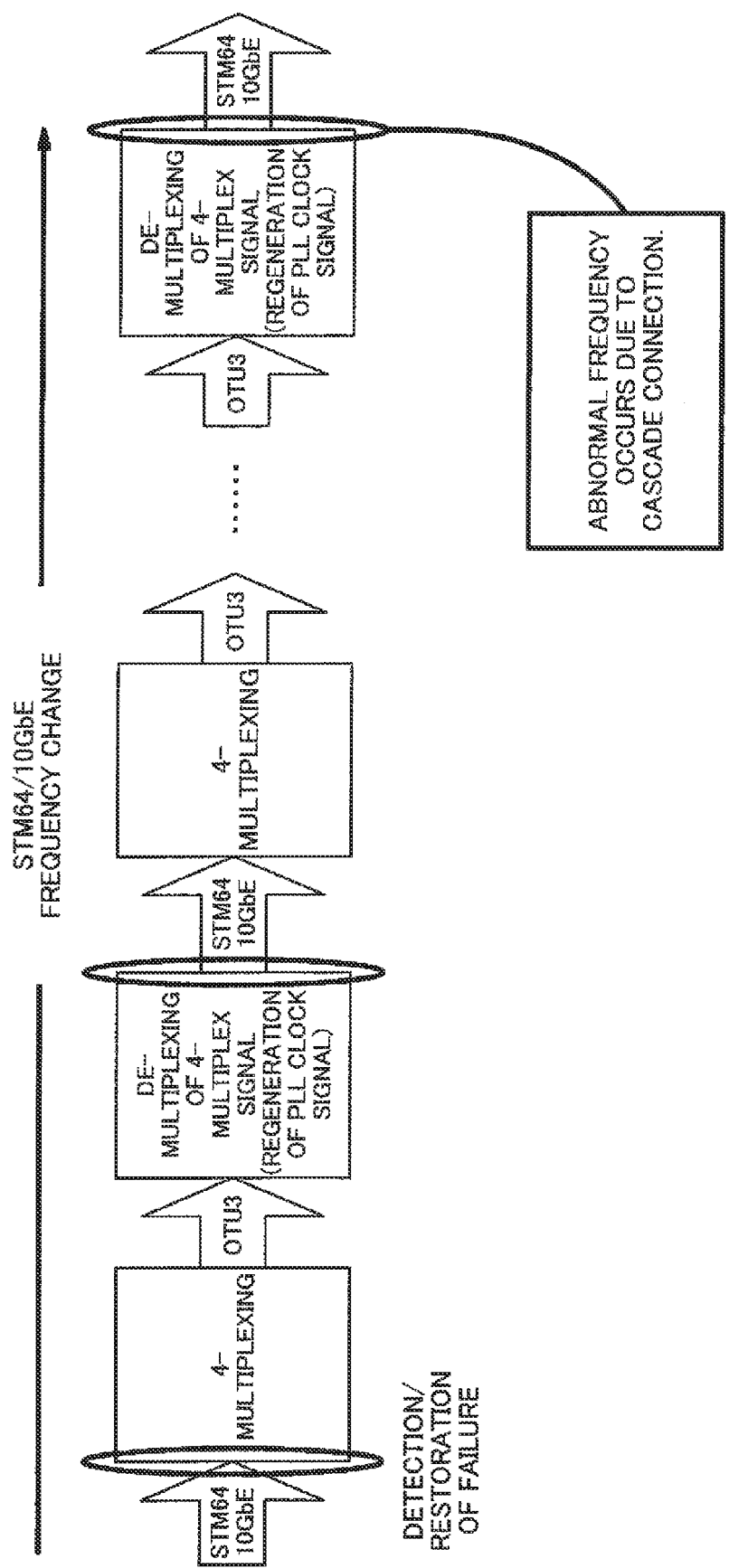
FIG. 4 is a fourth diagram to explain a problem which is caused in the PLL circuit related to the present invention.
Figure 5:
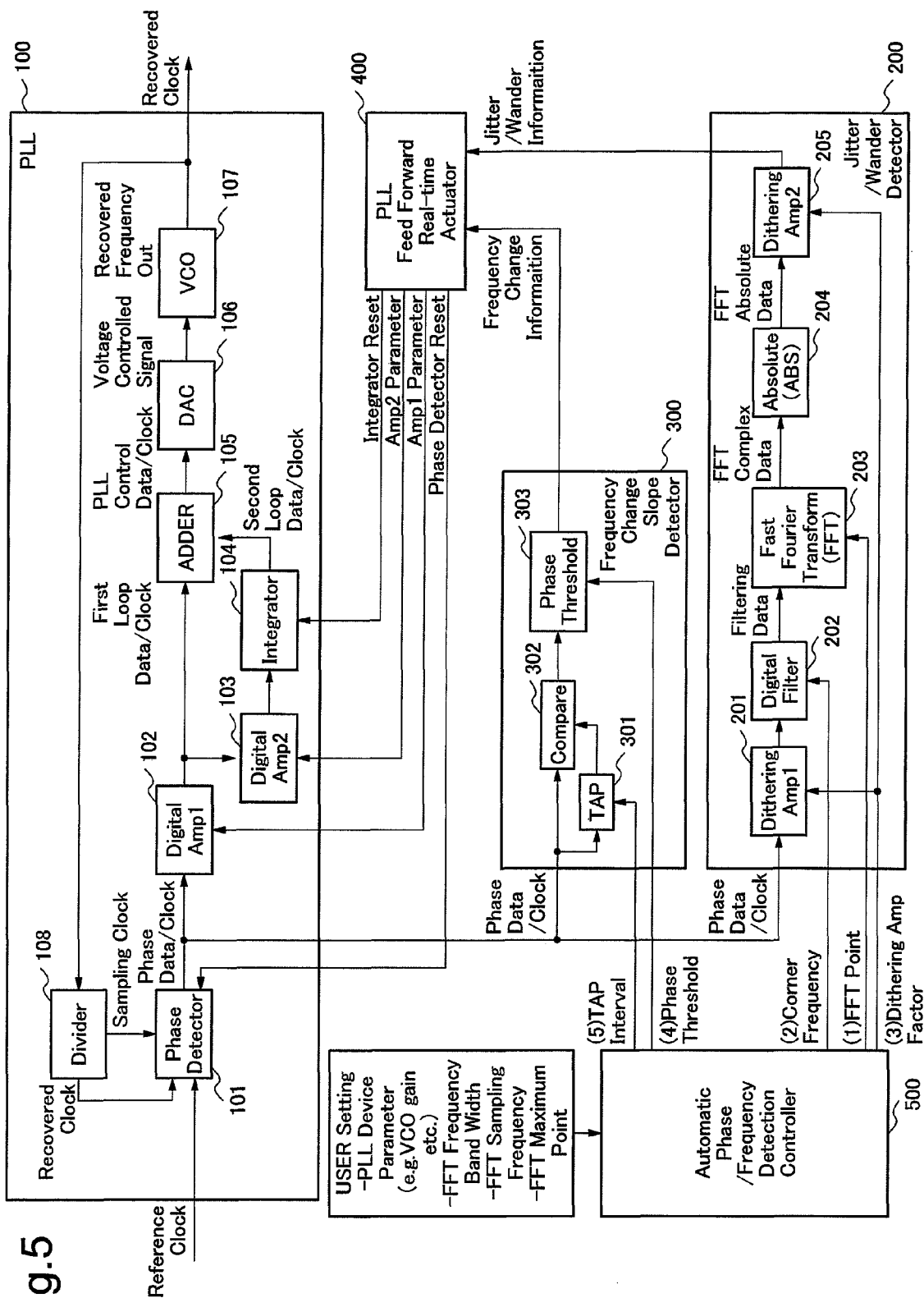
FIG. 5 shows an exemplary configuration of a PLL circuit according to a first exemplary embodiment of the present invention.

FIG. 5 shows an exemplary configuration of the PLL circuit according to the first exemplary embodiment of the present invention. First, an outline of the PLL circuit according to the first exemplary embodiment will be described in the following with reference to FIG. 5.

The PLL circuit according to the first exemplary embodiment detects and processes a jitter/wander component and a frequency change state on the basis of phase comparison data of a PLL unit 100 which regenerates a clock signal of a SDH signal or an Ethernet signal from an OTN signal. Then, the PLL circuit according to the first exemplary embodiment controls loop gain of the PLL unit 100 on the basis of a result of the process.

Specifically, the PLL circuit according to the first exemplary embodiment includes a Jitter/Wander Detector unit 200, a Frequency Change Slope Detector unit 300 and a PLL Feed Forward Real-time Actuator unit 400. The Jitter/Wander Detector unit 200 detects and processes the jitter/wander component, and creates jitter/wander information. The Frequency Change Slope Detector unit 300 detects and processes the frequency change state, and creates frequency change information. The PLL Feed Forward Real-time Actuator unit 400 controls the loop gain of the PLL unit on the basis of the jitter/wander information and the frequency change information.

As a result, the PLL circuit according to the first exemplary embodiment can realize high-speed frequency tracking performance while satisfying jitter/wander suppressing performance. Hereinafter, the PLL circuit according to the first exemplary embodiment will be described in detail with reference to accompanying drawings.

First, a configuration of each unit will be described, and afterward an operation of each unit will be described.

<Configuration of PLL Circuit>

First, a configuration of the PLL circuit according to the first exemplary embodiment will be described in the following with reference to FIG. 5.

The PLL circuit according to the exemplary embodiment is a Feed Forward type PLL circuit which regenerates a SDH clock signal (622.08 MHz) or an Ethernet clock signal (644.53125 MHz) from an OTU3 signal (43.018413559 GHz).

The PLL circuit according to the first exemplary embodiment includes the PLL unit 100, the Jitter/Wander Detector unit 200, the Frequency Change Slope Detector unit 300, the PLL Feed Forward Real-time Actuator unit 400 and an Automatic Phase/Frequency Detection Controller unit 500.

The PLL unit 100 is a general complete-integral type digital PLL which can work dynamically by use of a control parameter provided from outside.

The Jitter/Wander Detector unit 200 detects and processes the jitter/wander component in real time out of the phase comparison data (Phase Data/Clock) of the PLL unit 100 by use of FFT (Fast Fourier Transform).

The Frequency Change Slope Detector unit 300 detects and processes slope of the frequency change (frequency change state) in real time out of the phase comparison data (Phase Data/Clock) of the PLL unit 100.

The PLL Feed Forward Real-time Actuator unit 400 controls the loop gain of the PLL unit 100 in real time on the basis of Jitter/Wander Information provided by the Jitter/Wander Detector unit 200, and the Frequency Change Information provided by the Frequency Change Slope Detector part 300.

The Automatic Phase/Frequency Detection Controller unit 500 creates information for controlling operations of the Jitter/Wander Detector unit 200 and the Frequency Change Slope Detector unit 300 automatically on the basis of each user setting data (USER Setting). The following information is exemplified as the user setting data (USER Setting), as shown in FIG. 5.

PLL Device Parameter (e.g. VCO gain etc.)
FFT Frequency Band Width
FFT Sampling Frequency
FFT Maximum Point The information is used in a process which will be described later in FIG. 18.

The PLL Device Parameter means a design parameter of PLL. The FFT Frequency Band Width means a calculation range of FFT. The FFT Sampling Frequency means number of sampling frequency information, which is also a phase difference information, per one second. The FFT Maximum Point means number of points of FFT.

The configuration of the PLL circuit according to the first exemplary embodiment is shown in FIG. 5. The PLL circuit according to the exemplary embodiment detects and processes the jitter/wander component and the frequency change state in real time out of the phase comparison data (Phase Data/Clock) of the PLL unit 100. The PLL circuit according to the first exemplary embodiment comprises a Feed Forward type PLL circuit which can make the result of the process be reflected to the PLL unit 100 in real time. As a result, the PLL circuit according to the first exemplary embodiment realizes the high-speed frequency tracking performance while satisfying the jitter/wander suppressing performance which is originally in the trade-off relation with the frequency tracking performance.

<Configuration of PLL Unit 100>

Next, a configuration of the PLL unit 100 will be described. The PLL unit 100 includes a Phase Detector part 101, a Digital Amp1 part 102, a Digital Amp2 part 103, an Integrator part 104, an ADDER part 105, a DAC part 106, a VCO part 107 and a Divider part 108.

The Phase Detector part 101 detects a phase difference between an input signal (Reference Clock) and a VCO regeneration signal (Recovered Clock).

The Digital Amp1 part 102 amplifies a signal which is provided by the Phase Detector part 101, and inputs the amplified signal into the ADDER part 105.

The Digital Amp2 part 103 amplifies a signal which is provided by the Digital Amp1 part 102 and, inputs the amplified signal to the Integrator part 104.

The Integrator part 104 carries out integration of a signal which is provided by the Digital Amp2 part 103, and inputs a result of integration into the ADDER part 105.

The ADDER part 105 carries out addition of the signal which is provided by the Digital Amp1 part 102, and the signal which is provided by the Integrator part 104, and outputs a result of the addition as a digital signal.

The DAC part 106 converts the digital signal, which is provided by the ADDER part 105, into an analog signal.

The VCO part 107 changes output frequency on the basis of the analog signal which is provided by the DAC part 106.

The Divider part 108 divides frequency of the output signal which is provided by the VCO part 107.

In the PLL unit 100, the Phase Detector part 101, the Digital Amp1 part 102, the Digital Amp2 part 103 and the Integrator part 104 are Function Blocks whose parameter such as the amplifier gain can be controlled dynamically from outside.

<Configuration of Jitter/Wander Detector Unit 200>

Next, a configuration of the Jitter/Wander Detector unit 200 will be described.

The Jitter/Wander Detector unit 200 includes a Dithering Amp1 part 201, a Digital Filter part 202, a FFT processing part 203, an Absolute part 204 and a Dithering Amp2 part 205.

The Dithering Amp1 part 201 realizes making a FFT process of the Phase Data/Clock, which is provided by the PLL part 100, more precise. The Dithering Amp1 part 201 carries out a dithering multiplication process in which amplitude of the jitter/wander, which is indicated by the phase comparison data provided by the Phase Detector part 101, is multiplied by n in advance.

In order to make the phase comparison data (Phase Data/Clock) of the PLL unit 100 suitable to data for the FFT process, the Digital Filter part 202 carries out a filtering process to limit a frequency band of the FFT process. The filtering process will be described later.

The FFT processing part 203 detects and processes the jitter/wander component.

That is, the FFT processing part 203 detects the jitter/wander component, which is included in the phase comparison data provided by the PLL unit 100, out of data provided by the Digital Filter part 202. Then, the FFT processing part 203 outputs amplitude of the jitter/wander per FFT point as a complex number.

The Absolute part 204 converts the complex number, which is provided by the FFT processing part 203, into absolute number.

The Dithering Amp2 part 205 carries out a dithering division process in order to restore FFT data to the original amplitude value.

That is, the Dithering Amp2 part 205 carries out the dithering division process in which the amplitude of the jitter/wander indicated by the phase comparison data and multiplied by n (n is not smaller than 2) by the Dithering Amp1 part 201 is multiplied by 1/n. Henceforth, a set of the dithering multiplication process and the dithering division process may be called a dithering process. The dithering process will be described in detail in a clause of "Operation of Jitter/Wander Detector unit 200".

The Dithering Amp1 part 201, the Digital Filter part 202, the FFT processing part 203 and the Dithering Amp2 part 205 of the Jitter/Wander Detector part 200 are Function Blocks which work based on an external user information (Corner Frequency, FFT Point and Dithering Amp Factor).

<Exemplary Configuration of Frequency Change Slope Detector Unit 300>

Next, an exemplary configuration of the Frequency Change Slope Detector unit 300 will be described.

The Frequency Change Slope Detector unit 300 includes a TAP part 301, a Compare part 302 and a Phase Threshold part 303.

The TAP part 301 holds the phase comparison data (Phase Data/Clock), which is provided by the PLL part 100, at every sampling time.

The Compare part 302 compares past data and present data.

That is, the Compare part 302 compares the past phase comparison data provided by the TAP part 301 which can hold the phase comparison data at every phase comparing period of time, and the present phase comparison data provided by the PLL part 100. An operation of the Compare part 302 will be described later.

The Phase Threshold part 303 judges whether an amount of the phase change provided by the Compare part 302 is not smaller than a threshold value, and notifies the PLL Feed Forward Real-time Actuator part 400 of the Frequency Change Information on existence of a rapid frequency change.

The TAP part 301 and the Phase Threshold part 303 of the Frequency Change Slope Detector unit 300 are Function Blocks which calculate a TAP interval, number of TAPs or the like on the basis of the external user information (TAP Interval and Phase Threshold).

<Function of PLL Feed Forward Real-Time Actuator Unit 400>

Next, a function of the PLL Feed Forward Real-time Actuator unit 400 will be described.

The PLL Feed Forward Real-time Actuator part 400 outputs a signal for controlling the PLL unit 100 on the basis of the Jitter/Wander Information provided by the Jitter/Wander Detector unit 200, and the Frequency Change Information provided by the Frequency Change Slope Detector unit 300. That is, the PLL Feed Forward Real-time Actuator unit 400 controls the PLL unit 100 so that the PLL unit 100 may satisfy the expected jitter/wander suppressing characteristic and the expected frequency tracking characteristic. For this purpose, the PLL Feed Forward Real-time Actuator unit 400 calculates amplifier gains of the Digital Amp1 part 102 and the Digital Amp2 part 103 of the PLL unit 100 in real time and sets the amplifier gains to the Digital Amp1 part 102 and the Digital Amp2 part 103 respectively.

Furthermore, the PLL Feed Forward Real-time Actuator unit 400 carries out a reset control for the Phase Detector part 101 and the Integrator part 104 of the PLL unit 100 in real time.

Details of an operation of the PLL Feed Forward Real-time Actuator unit 400 will be described later in a clause of "Operation of PLL Feed Forward Real-time Actuator unit 400".

<Function of Automatic Phase/Frequency Detection Controller Unit 500>

Next, a function of the Automatic Phase/Frequency Detection Controller unit 500 will be described.

The Automatic Phase/Frequency Detection Controller unit 500 has a function to calculate operation parameters of the Jitter/Wander Detector unit 200 and the Frequency Change Slope Detector unit 300 on the basis of the user setting data (USER Setting).

Details of an operation of the Automatic Phase/Frequency Detection Controller unit 500 will be described later in a clause of "Operation of Automatic Phase/Frequency Detection Controller unit 500".

<Operation of PLL Circuit According to the First Exemplary Embodiment>

Next, an operation of the PLL circuit according to the exemplary embodiment will be described.

In order to satisfy the output jitter/wander performance which is recommended by Telcordia/ITU-T (International Telecommunication Union Telecommunication Standardization Sector), the PLL circuit is necessary as a basic function.

The PLL unit 100 regenerates a signal which is synchronized with the inputted OTN signal (Reference Clock).

First, the Phase Detector part 101 detects the phase difference between the inputted signal (Reference Clock) and the regenerated signal (Recovered Clock) which is generated through the Divider 108 by dividing the frequency of the clock signal provided by the VCO part 107. Then, the Phase Detector part 101 provides the Digital Amp1 part 102 with the detected phase difference as phase difference data (Phase Data/Clock).

The Digital Amp1 part 102 amplifies the signal which is provided by the Phase Detector part 101. Then, the Digital Amp1 part 102 provides the Digital Amp2 part 103 and the ADDER part 105 with the amplified signal.

The Digital Amp2 part 103 amplifies the signal which is provided by the Digital Amp1 part 102. Then, the Digital Amp2 part 103 provides the Integrator part 104 with the amplified signal.

The Integrator part 104 carries out a second loop integration process. Then, the Integrator part 104 provides the ADDER part 105 with the second loop signal which is integrated.

The PLL circuit of the complete integration type carries out frequency control by use of the first loop, and phase control by use of the second loop. The ADDER part 105 adds the first loop signal (First Loop Data/Clock) and the second loop signal (Second Loop Data/Clock)) which are provided by two loops respectively. Then, the DAC part 106 performs digital-analog conversion of the result of the addition and provides the VCO part 107 with the analog signal. The VCO part 107 generates a signal whose frequency is controlled on the basis of the inputted analog signal.

According to the above-mentioned operation of the PLL part 100, in the case that the input signal (Reference Clock) includes the jitter/wander component with large amplitude, and in the case that the frequency changes rapidly, the jitter/wander component can not be suppressed thoroughly and emerges in the output signal (Recovered Clock). To solve the problem mentioned above, the PLL circuit according to the exemplary embodiment includes two detection circuits (the Jitter/Wander Detector unit 200 and the Frequency Change Slope Detector unit 300) and two control circuits (the PLL Feed Forward Real-time Actuator unit 400 and the Automatic Phase/Frequency Detection Controller unit 500).

<Operation of First Detection Circuit; the Jitter/Wander Detector Unit 200>

The Jitter/Wander Detector unit 200, which is a first detection circuit, receives the phase comparison data (Phase Data/Clock) from the PLL part 100 at every phase comparison period.

The phase comparison data is information on amplitude of the phase difference, which is detected by the Phase Detector part 101, between the input signal (Reference Clock), and the regenerated signal (Recovered Clock) which is generated through the Divider 108's dividing the frequency of the clock signal provided by the VCO part 107.

In general, the FFT process is used for processing the jitter/wander component. In the FFT process, a result with higher precision is obtained as FFT sampling frequency becomes higher. However, in order to make the FFT sampling frequency high, it is necessary to use a FFT processing device such as an expensive DSP (Digital Signal Processor). Moreover, in the case that the jitter/wander component is small, an amplitude error may be large in some cases due to a round-off or the like in the PLL process.

As mentioned above, it is difficult to realize the high frequency FFT sampling by use of a low-price device. Furthermore, in the case that the amplitude of the jitter/wander is small, the jitter/wander component may not be detected correctly in some cases if the phase comparison data is processed by FFT as it is.

In order to solve these problems, the Jitter/Wander Detector unit 200 includes not only the Dithering Amp1 part 201 and the Dithering Amp2 part 205, but also a means to reduce a load of the FFT process. The Dithering Amp1 part 201 multiplies the amplitude of the jitter/wander component, which is indicated by the phase comparison data, by n (n is not smaller than 2) in advance. The Dithering Amp2 part 205 multiplies the amplitude of the jitter/wander component by 1/n after the FFT process. It is possible to make the PLL process, which is carried out by the FFT processing part 203, more precise due to including the Dithering Amp1 part 201 and the Dithering Amp2 part 205 which carry out the dithering process.

Here, n is number not smaller than 2 and is set in advance.

Figure 6:
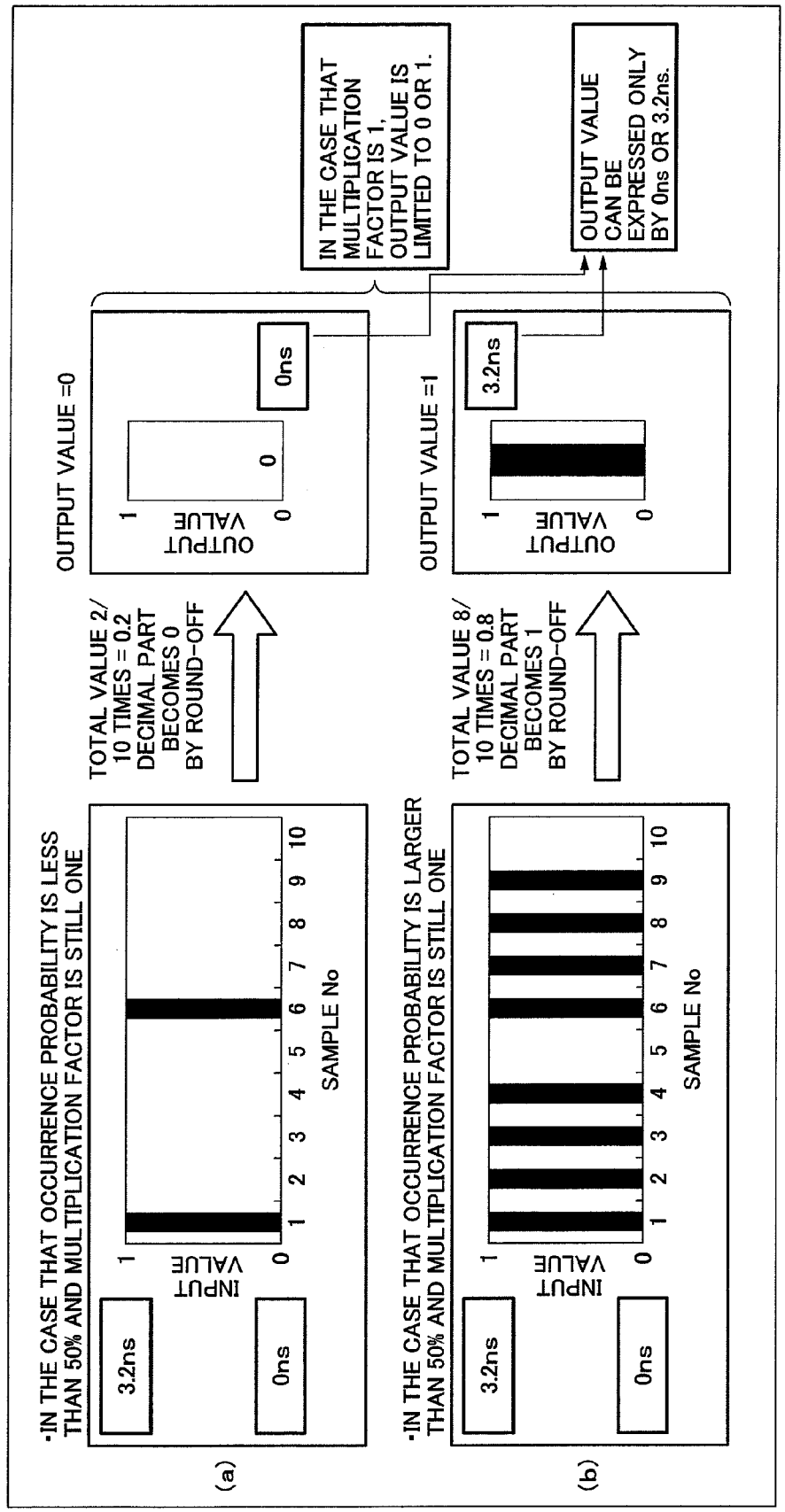
FIG. 6 is a first diagram to explain how to make a FFT process more precise.
Figure 7:
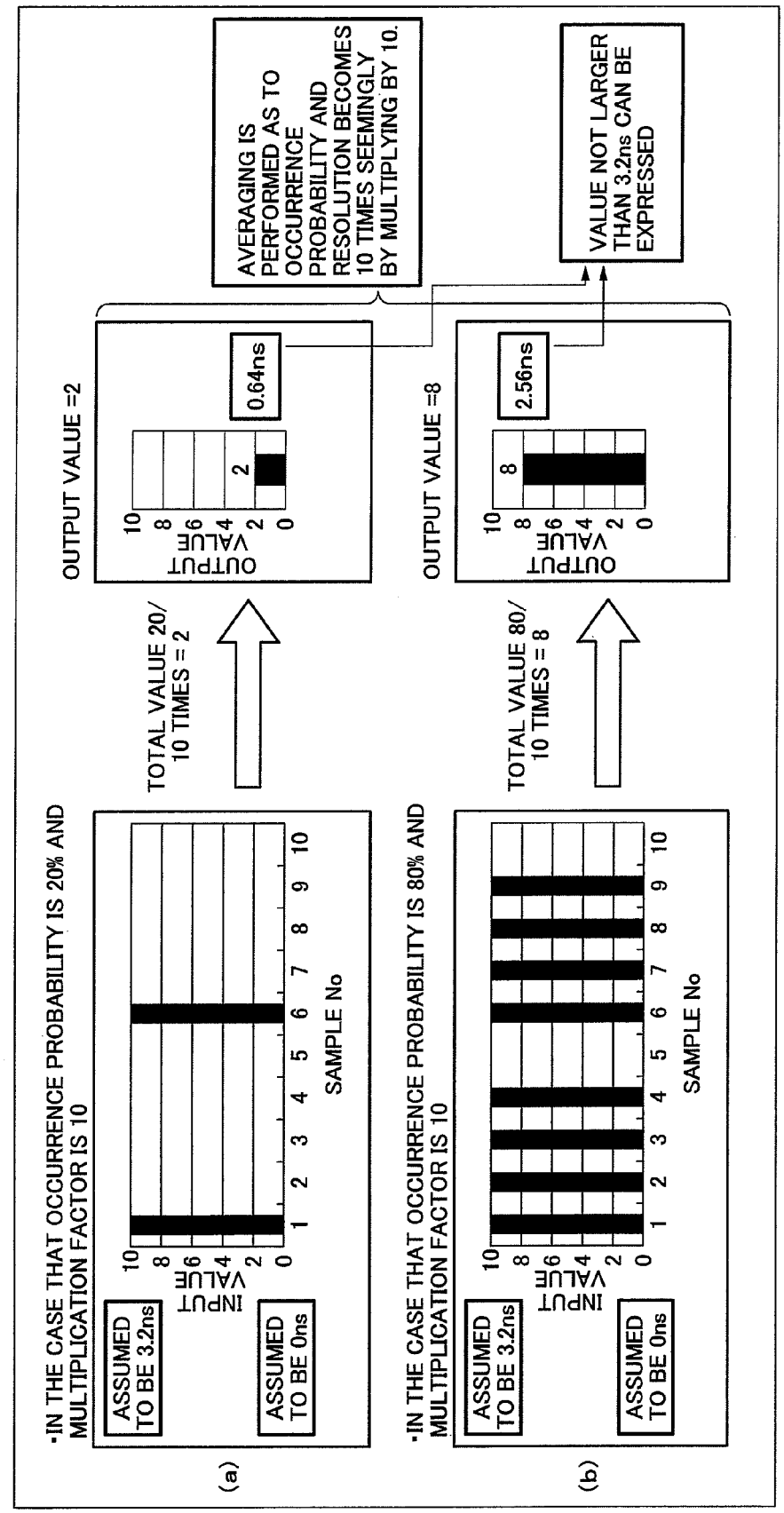
FIG. 7 is a second diagram to explain how to make the FFT process more precise.

An operation image is shown in FIG. 6 and FIG. 7.

FIG. 6 is a first diagram to explain how to make the FFT process more precise.

FIG. 6 shows an output amplitude of the jitter/wander component which is generated in the case that the FFT process is carried out for the phase comparison data as it is. Here, resolution of the jitter amplitude is assumed to be "3.2 ns (311.04 MHz)".

In the following description, "occurrence of 1bit width jitter" means "occurrence of 3.2 ns jitter".

According to FIG. 6 (*a*), the 1 bit width jitter occurs actually only twice out of 10 times of sampling. However, due to a process such as the round-off in the butterfly calculation of the FFT process, the actual jitter amplitude of output data in the FFT process becomes 0 bit, that is, 0 ns.

Similarly, according to FIG. 6 (*b*), the 1 bit width jitter occurs actually 8 times out of 10 times of sampling. However, the actual jitter of the output data in the FFT process becomes 1 bit, that is, 3.2 ns.

That is, in the case that the PLL sampling period is 3.2 ns, it is impossible to detect jitter not larger than 3.2 ns.

FIG. 7 is a second diagram to explain how to make the FFT process more precise.

According to FIG. 7, in order to improve the above-mentioned problem, the amplitude of the jitter included in the phase comparison data is multiplied by 10 (n=10) in advance, and afterward, the amplitude of the jitter included in the output data of the FFT process is multiplied by 1/10. Consequently, it is possible to detect the jitter amplitude even if resolution in the time axis is not longer, than the PLL sampling period.

In the actual FFT process, the Digital Filter part 202 carries out band limitation on the basis of frequency band in which the FFT process is carried out. Then, the FFT processing part 203 carries out the FFT process of the output signal of the Digital Filter part 202. Furthermore, the Absolute part 204 converts a complex number which is an output signal of the FFT processing part 203 into an absolute value. The Dithering Amp2 205 multiplies the amplitude of the jitter/wander, which is the output data of the FFT process, by 1/n, and provides the PLL Feed Forward Real-time Actuator unit 400 with the multiplied jitter/wander as Jitter/Wander Information.

According to the exemplary embodiment, the load of the FFT processing part 203 in the FFT process is reduced as described hereinafter. As a result, it is possible that even a FFT processing device such as inexpensive DSP (Digital Signal Processor) or the like carries out the process mentioned above.

Figure 8:
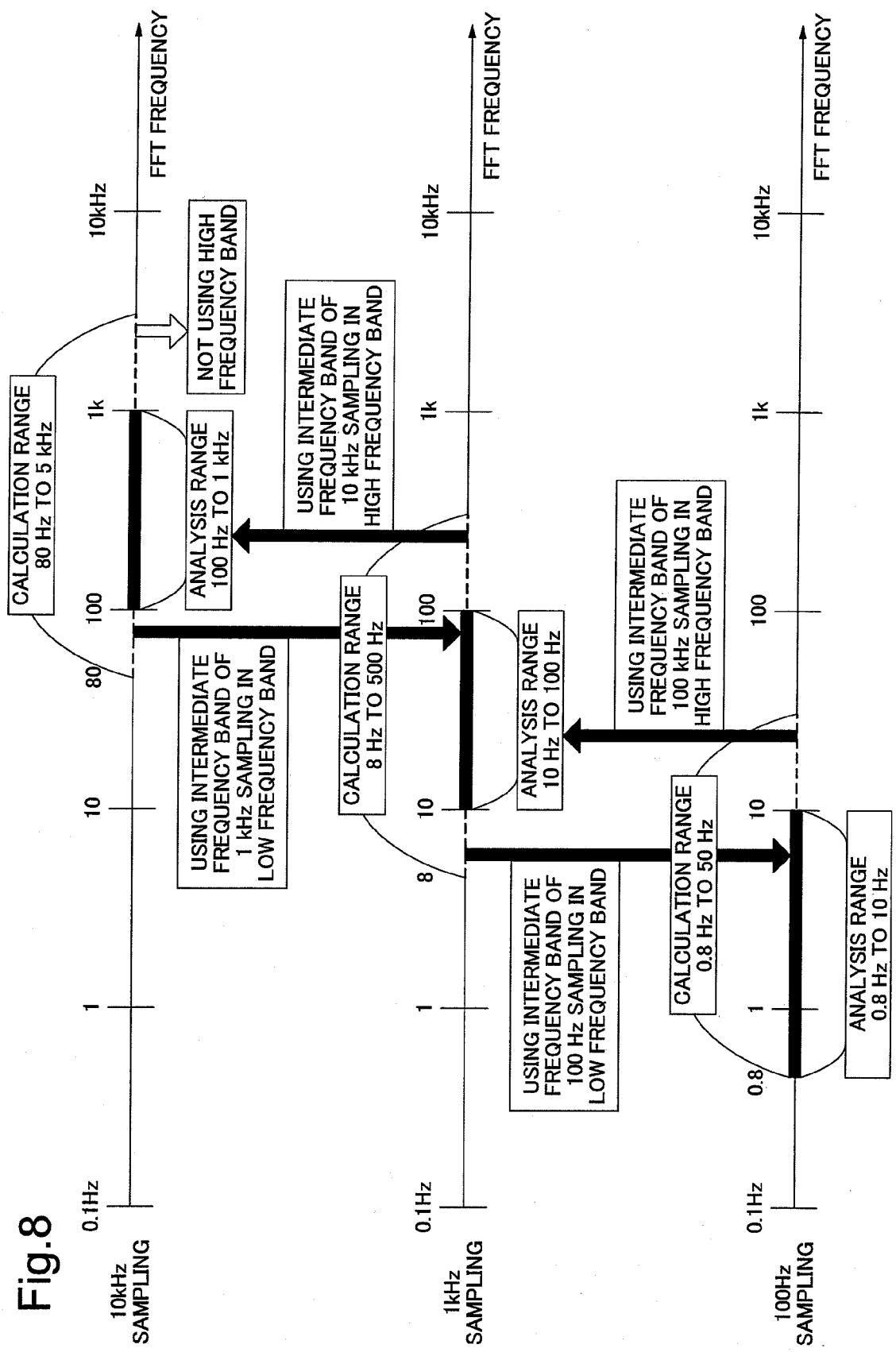
FIG. 8 is a diagram to explain how to make a load of the FFT process decreasing.

FIG. 8 shows an image of a process to reduce the load in the FFT process. For example, in the case that the FFT process is carried out at a range of 1 Hz to 1 kHz, 1000 to 10000 FFT points are usually needed. Regularly, it is necessary to use an expensive DSP, an expensive FPGA (Field Programmable Gate Array) or the like in order to carry out the FFT process of 1000 to 10000 points in real time, while the above mention depends on performance of a processor such as DSP. For example, in the case of the FFT process in a 1 Hz point unit at a band not lower than 10 Hz, the FFT process is carried out at 10 Hz, 11 Hz, 12 Hz, 13 Hz . . . , or 100 Hz, 101 Hz, 102 Hz . . . . The FFT process in the 1 Hz point unit mentioned above may be superfluous in consideration of the FFT process which is required according to the exemplary embodiment.

According to the exemplary embodiment, a FFT splitting process is carried out in order to avoid increase in cost of the PLL circuit due to the existence of such superfluous processes. As shown in FIG. 8, the FFT splitting process means a process in which the sampling frequency is changed per each FFT frequency. The number of FFT points of 1000 to 10000 points required according to a conventional FFT can be reduced to, for example, 384 points through carrying out the FFT splitting process as described below. That is, by virtue of the FFT splitting process, the number of FFT points is reduced to about 1/3 to 1/26 of the number of FFT points in the conventional process.

Specifically, the FFT frequency band is divided in a LOG decade scale unit. At 100 Hz to 1 kHz band, the FFT sampling frequency is set to 10 kHz which is the same as that of the conventional FFT, and the number of the points is set to 128. Consequently, the resolution of the FFT process is 78 Hz.

Similarly, at 10 Hz to 100 Hz band, the FFT sampling frequency is set to 1 kHz which is corresponding to 1/10 of the conventional FFT sampling frequency, and the number of the points is set to 128. Consequently, the resolution of the FFT process is 7.8 Hz. Moreover, at 1 Hz to 10 Hz band, the FFT sampling frequency is set to 100 Hz which is corresponding to 1/100 of the conventional FFT sampling frequency, and the number of the points is set to 128. Consequently, the resolution of the FFT process is 0.78 Hz.

Accordingly, by virtue of the FFT splitting process, the number of FFT points is 128×3=384 points.

In the case that the FFT splitting process is carried out, it is necessary to use a plurality of Digital Filter parts 202 which are arranged in front of the FFT processing part 203 and whose number is equal to number of the divided frequency bands. However, the increase in number of the Digital filter parts 202 does not have so severe influence on a whole of processes in comparison with the decrease of the amount of the processes due to the decrease of the number of FFT points.

Here, in the case of carrying out the FFT process, a discontinuous point is generated originally at a start point and an end point of sampling data with finite length, since the sampling data with the finite length is handled as sampling data with infinite length. Then, a window function is usually used in order to reduce false detection of the jitter/wander which is caused by the discontinuity.

However, an area where the false detection of the jitter/wander is generated due to the existence of discontinuity of the sampling data with the finite length is not used in the PLL process, by virtue of adopting the FFT splitting process shown in FIG. 8. For this reason, it is unnecessary to use the window function according to the exemplary embodiment. Accordingly, it is possible to reduce the load of DSP through adopting the FFT splitting process. The reason will be described in the following. That is, for example, in the case of 10 kHz sampling, an actual analysis range is from 100 Hz to 1 kHz, while a calculation range, where the FFT point exists, is from 80 Hz to 5 kHz. Consequently, an area of the high frequency side and the low frequency side is not used in the FFT process.

The Jitter/Wander Detector unit 200 provides the PLL Feed Forward Real-time Actuator unit 400 with the PLL parameter based on the Jitter/Wander Information which is detected and processed in real time by use of the above mentioned procedure.

Here, details of control of the PLL unit 100 on the basis of the jitter/wander information which is detected in real time and analyzed by the Jitter/Wander Detector unit 200 will be described in a clause of "Operation of first control circuit; PLL Feed Forward Real-time Actuator unit 400".

<Operation of Second Detection Circuit; Frequency Change Slope Detector Part 300>

The Frequency Change Slope Detector unit 300, which is a second detection circuit, receives the phase comparison data (Phase Data/Clock) from the PLL unit 100 at every phase comparison period, similarly to the Jitter/Wander Detector unit 200.

The Frequency Change Slope Detector unit 300 detects the rapid frequency change through measuring the amount of phase change, which is indicated by the phase comparison data, at a certain period of time. Specifically, the Compare part 302 compares the past phase comparison data provided by the TAP part 301 which can hold the phase comparison data, and the present phase comparison data provided by the PLL part 100 at every phase comparing period of time. Then, the Frequency Change Slope Detector unit 300 detects the amount of the phase change at every phase comparison period of time and substitutes the amount of the phase change into the following formula, and judges whether the rapid frequency change occurs.

$[2\pi \Delta f(Hz)]/[\text{direct current loop gain}]=[\text{amount of phase change (radian)}]$  formula 1 (known function)

$[2\pi]=\text{phase comparison period(sec)}=1/\text{phase comparison frequency(Hz)}$  formula 2 (known function)

$[\Delta f]=\text{frequency change component(Hz)}=\text{phase comparison frequency(Hz)} \times \text{amount of frequency change(ppm)}$  formula 3 (known function)

$[(1/\text{phase comparison frequency}) \times (\text{phase comparison frequency} \times \text{amount of frequency change}) \times (1/\text{direct current loop gain})]=[\text{amount of frequency change(ppm)}]/[\text{direct current loop gain}]=[\text{amount of phase change(sec)}]$  formula 4 (known function)

Here, the Phase Threshold part 303 judges whether the amount of the phase change, which is provided by the Compare part 302, is not smaller than a phase change threshold value (rapid frequency change threshold value) which is set from outside. Then, the Phase Threshold part 303 notifies the PLL Feed Forward Real-time Actuator unit 400 of the Frequency Change Information, which indicates that the rapid frequency change occurs, in the case that the amount of the frequency change, which is provided by the Compare part 302, is not smaller than the threshold level.

The PLL Feed Forward Real-time Actuator unit 400 makes the operation of the PLL unit 100 track the rapid frequency change at high speed. For this purpose, the PLL Feed Forward Real-time Actuator unit 400 carries out control to reset the Phase Detector part 101 and the Integrator part 104 of the PLL unit 100 on the basis of the Frequency Change Information.

Through carrying out the control to reset the Phase Detector part 101, the frequency information of Phase Detector part 101 is cleared, synchronization (detection) starts from the frequency which is generated just after the reset. Moreover, since the phase information of the Integrator part 104 is cleared through carrying out the control to reset the Integrator part 104 at a time of turning its power supply on, the Integrator part 104 starts synchronization (integration) from the phase which is generated just after the reset.

Furthermore, the PLL Feed Forward Real-time Actuator unit 400 controls the amplifier gains of the Digital Amp1 part 102 and the Digital Amp2 part 103 of the PLL unit 100 in real time.

As mentioned above, the Frequency Change Slope Detector unit 300 makes the operation of the PLL part 100 track the rapid frequency change at the high speed on the basis of the Frequency Change Information which is detected and processed in real time. As a result, the PLL part 100 can suppress a link failure which may be caused at a time when the rapid frequency change occurs in the SDH signal or the Ethernet signal, and an abnormal frequency alarm which may be caused at a time when the failure is restored in the case of the multistage connection.

Here, details of controlling the PLL part 100 on the basis of the frequency change information which the Frequency Change Slope Detector unit 300 detects and processes in real time will be described in the following clause of "Operation of PLL Feed Forward Real-time Actuator unit 400".

<Operation of First Control Circuit; PLL Feed Forward Real-Time Actuator Unit 400>

The PLL Feed Forward Real-time Actuator unit 400, which is a first control circuit, collects the Jitter/Wander Information which is provided by the Jitter/Wander Detector unit 200, and the Frequency Change Information which is provided by the Frequency Change Slope Detector unit 300. Then, the PLL Feed Forward Real-time Actuator unit 400 controls the PLL unit 100 on the basis of these information. First, a procedure in which the Real-time Actuator unit 400 controls the PLL unit 100 on the basis of the Jitter/Wander Information which is provided by the Jitter/Wander Detector unit 200 will be described in the following.

The Jitter/Wander Detector unit 200 outputs a result of the FFT analysis as the Jitter/Wander Information. The result of the FFT analysis means frequency information and amplitude information per each FFT point. Here, the jitter amplitude information is expressed in an unit of 1 bit which is corresponding to one PLL sampling period (3.2 ns). The PLL sampling period is a reciprocal of the PLL sampling frequency (number of times of sampling the phase difference per 1 second). According to the exemplary embodiment, it is assumed that the PLL sampling frequency is set to 311.04 MHz, and consequently the PLL sampling period is 3.2 ns. That is, in the description, it is assumed that the jitter/wander amplitude, which is corresponding to the amplitude information 1 bit, is 3.2 ns.

Figure 9:
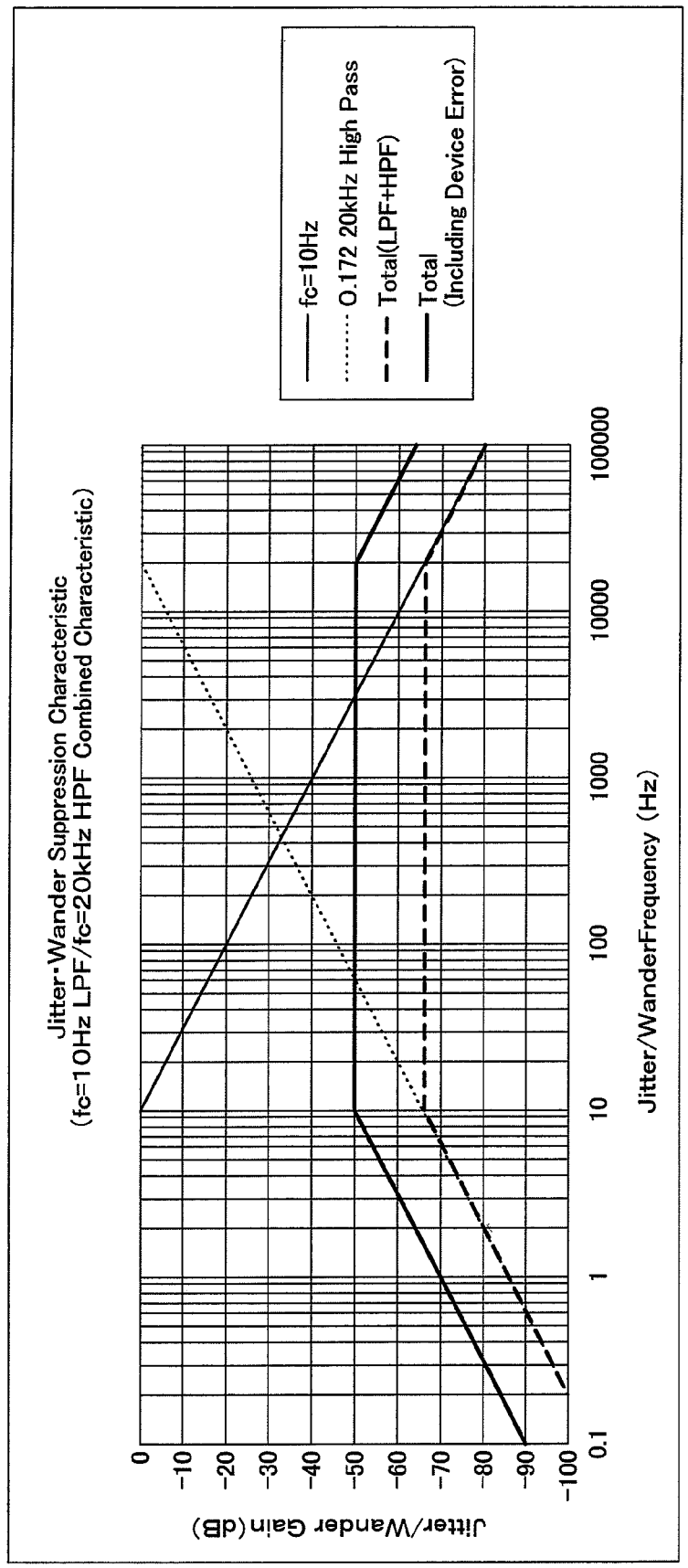
FIG. 9 shows a combined characteristic of a jitter/wander suppression characteristic of a PLL unit and a high pass filter characteristic of a jitter measuring instrument.

FIG. 9 shows a combined characteristic of the jitter/wander suppression characteristic (equivalent to low pass filter characteristic) of the PLL unit 100, and a high pass filter characteristic of the jitter measuring instrument. A fine solid line in FIG. 9 shows the jitter/wander suppression characteristic (default characteristic) under the condition that jitter/wander cut-off frequency (fc=Corner Frequency) of the PLL unit 100 is 10 Hz. Here, it is assumed that slope of the jitter/wander suppression characteristic of the PLL unit 100 is −20 dB/decade. The fine dotted line indicates the filter characteristic of the jitter measuring instrument which is recommended in ITU-T 0.172. The filter of the jitter measuring instrument is a high pass filter (HPF) with fc=20 kHz.

The combined characteristic, which synthesizes these two jitter/wander suppression characteristics, that is, the visible jitter/wander suppression characteristic which is measured by the jitter measuring instrument is indicated by a bold dotted line in FIG. 9 (Total (LPF+HPF) in FIG. 9).

The bold dotted line in FIG. 9 shows that the jitter suppression characteristic is −66 dB in the frequency range of 10 Hz to 20 kHz. However, an actual characteristic includes a device error of the PLL circuit and a measuring error of the measuring instrument. If these errors are considered as a margin, the jitter suppression level, which is indicated to be "−66 dB" in the figure, becomes about "−50 dB" actually (Total (including device error) shown by bold line in FIG. 9).

In this case, fc of LPF and fc of HPF are considered to be about 100 Hz and about 3 kHz, respectively through detecting a cross point of an extended line of the bold line below 10 Hz and a horizontal line of Jitter/Wander Gain=0 dB, and a cross point of an extended line of the bold line above 20 kHz and the horizontal line of Jitter/Wander Gain=0 dB respectively.

The exemplary embodiment will be described hereinafter in consideration of the margin.

Figure 10:
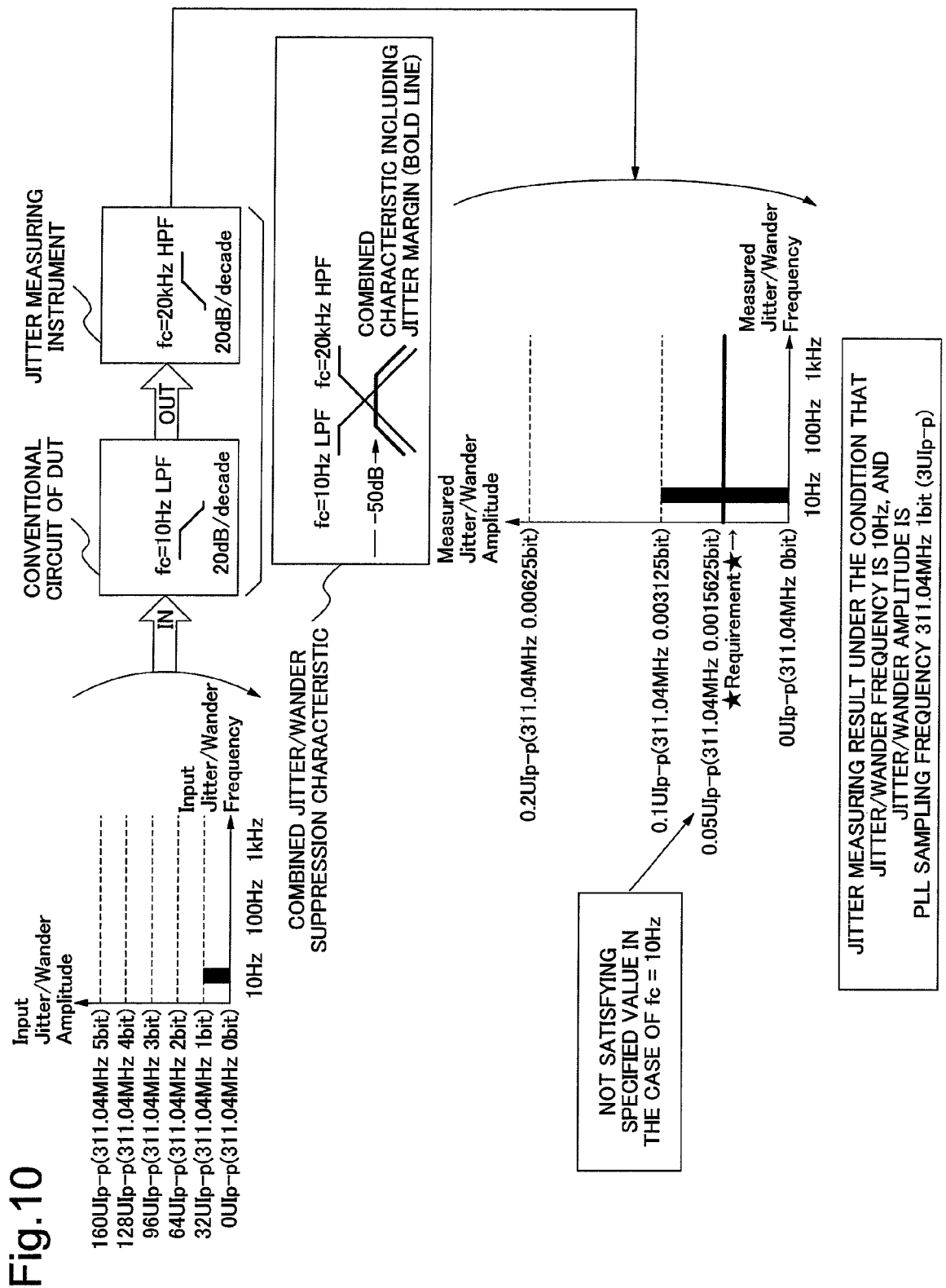
FIG. 10 is a first diagram to show a relation between frequency and amplitude of an input jitter, and frequency and amplitude of an output measured jitter of DUT (Device Under Test).
Figure 11:
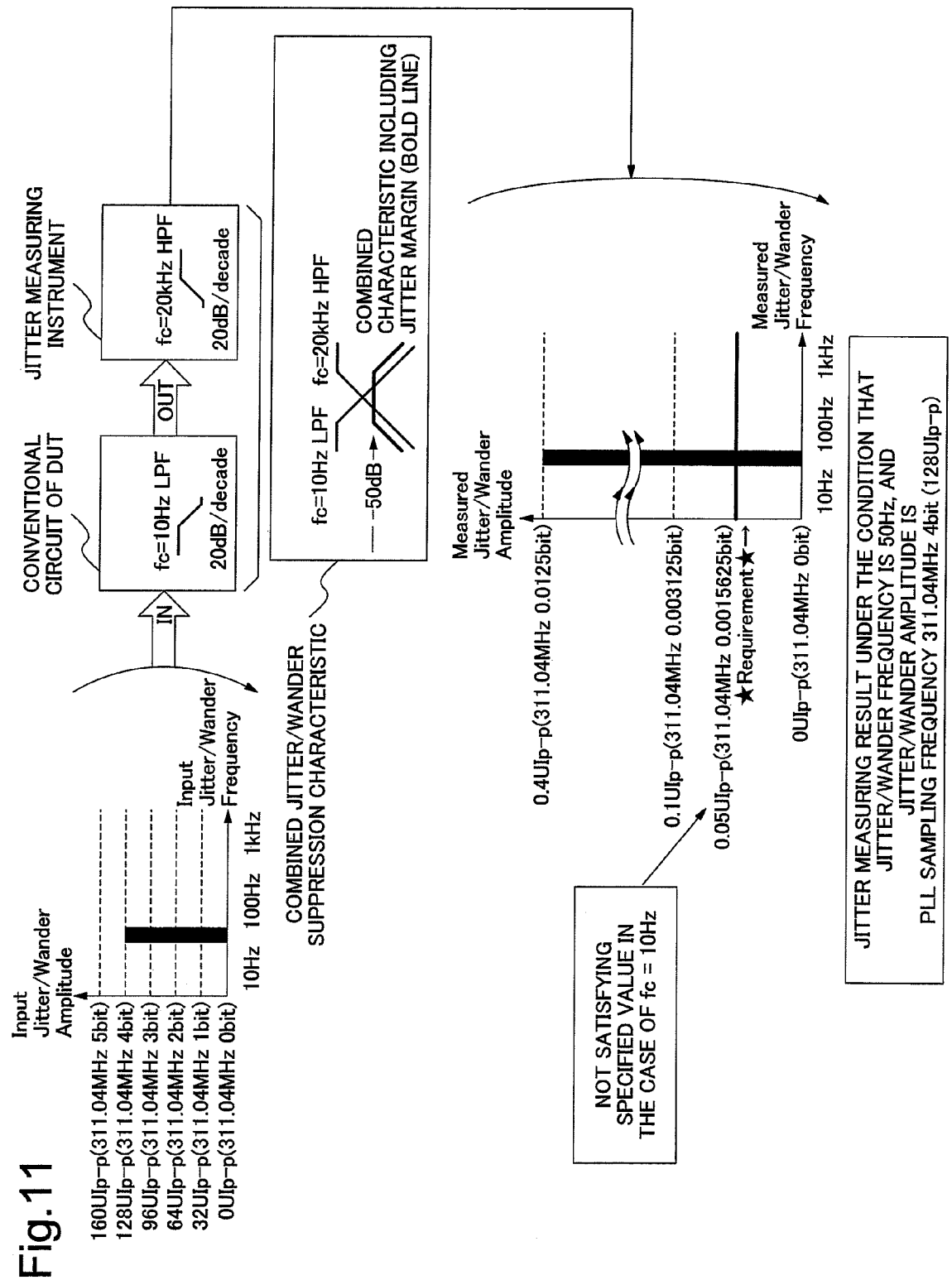
FIG. 11 is a second diagram to show a relation between the frequency and the amplitude of the input jitter, and the frequency and the amplitude of the output measured jitter of DUT (Device Under Test).
Figure 12:
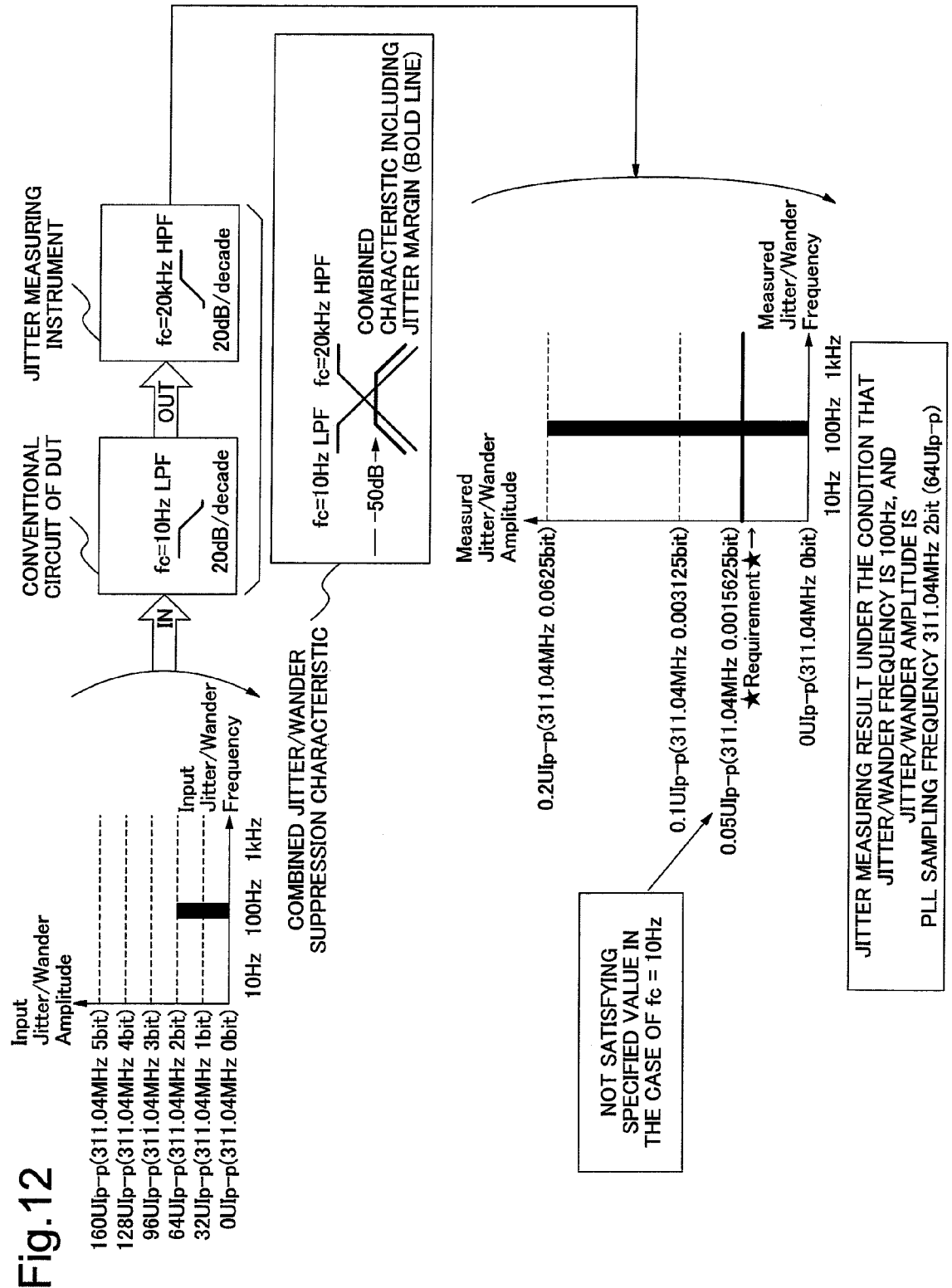
FIG. 12 is a third diagram to show a relation between the frequency and the amplitude of the input jitter, and the frequency and the amplitude of the output measured jitter of DUT (Device Under Test).

Each of FIG. 10 to FIG. 12 shows a relation between frequency and amplitude of an input jitter, and frequency and amplitude of an output measured jitter of DUT (Device Under Test).

According to the exemplary embodiment, a case that 1 UI is corresponding to a rate of STM 64 (9953.28 MHz) will be described hereinafter.

A reason why an internal specification of DUT is "0.05 UIp-p" will be described in the following. According to Telcordia/ITU-T, the jitter is specified to be not larger than "0.3 UIp-p". In order to satisfy the specification, a remaining jitter/wander component which an OTN/SDH device has is not larger than "0.1 UIp-p", and a remaining jitter/wander component of the jitter measuring instrument is not larger than "0.1 UIp-p". Taking into consideration the margin in the remaining "0.1 UIp-p", it is necessary to suppress the jitter/wander to be not larger than "0.05 UIp-p". As a result, the internal specification of DUT is "0.05 UIp-p".

An upper-left figure in FIG. 10 shows an outputted measurement result under the condition that the input jitter/wander frequency is 10 Hz and the input jitter/wander amplitude is 311.04 MHz 1 bit (32 UIp-p). Since the jitter amplitude is "0.1 UIp-p" in this case, the jitter amplitude can not satisfy the DUT internal specification that the jitter/wander should not be larger than "0.05 UIp-p"

In FIG. 10, a vertical axis of a bar graph indicates the jitter/wander amplitude. For example, 32 UIp-p (311.04 MHz 1bit) means that the jitter/wander amplitude is 32 UIp-p, and its amplitude is corresponding to 1 bit (3.2 ns) of 311.04 MHz which is the PLL sampling frequency.

Similarly, FIG. 11 shows an outputted measurement result under the condition that the input jitter/wander frequency is 50 Hz and the input jitter/wander amplitude is 311.04 MHz 4 bit (128 UIp-p). FIG. 12 shows an outputted measurement result under the condition that the input jitter/wander frequency is 100 Hz and the input jitter/wander amplitude is 311.04 MHz 2 bit (64 UIp-p).

As shown in FIGS. 10 to 12, any outputted measurement result can not satisfy the DUT internal specification that the jitter/wander should not be larger than "0.05 UIp-p".

In order to solve the above-mentioned problem, the PLL Feed Forward Real-time Actuator unit 400 calculates the fc according to the following formula 6 on the basis of input jitter/wander detection and analysis information, and carries out jitter/wander suppressing control adaptive to the jitter/wander component in real time. As a result, it is possible to improve increase of the output wander due to degradation of the input frequency tracking performance which occurs in the case that fc is always low (for example, fc=0.1 Hz or the like). That is, the PLL Feed Forward Real-time Actuator unit 400 carries out the jitter/wander suppressing control so as to make the tracking performance high in the case of the small jitter/wander, and so as to make the jitter/wander suppression performance improved adaptively to the frequency and the amplitude in the case that the jitter/wander exists to some extent.

Hereinafter, details will be described in specific examples 1 to 3 and FIGS. 13 to 15.

Figure 13:
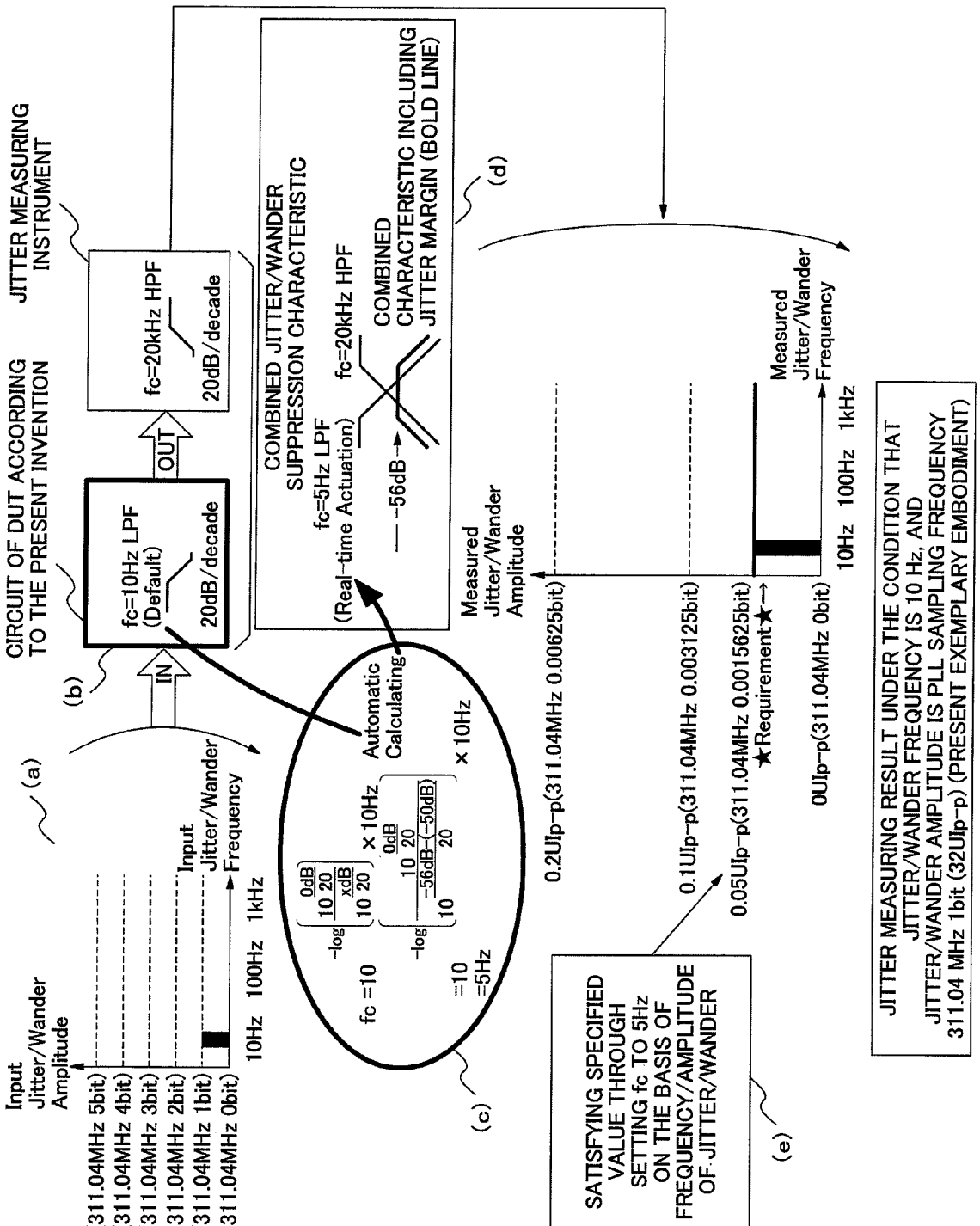
FIG. 13 is a first diagram to show a relation between frequency and amplitude of an input jitter, and frequency and amplitude of an output measured jitter of DUT (Device Under Test) according to the exemplary embodiment of the present invention.
Figure 14:
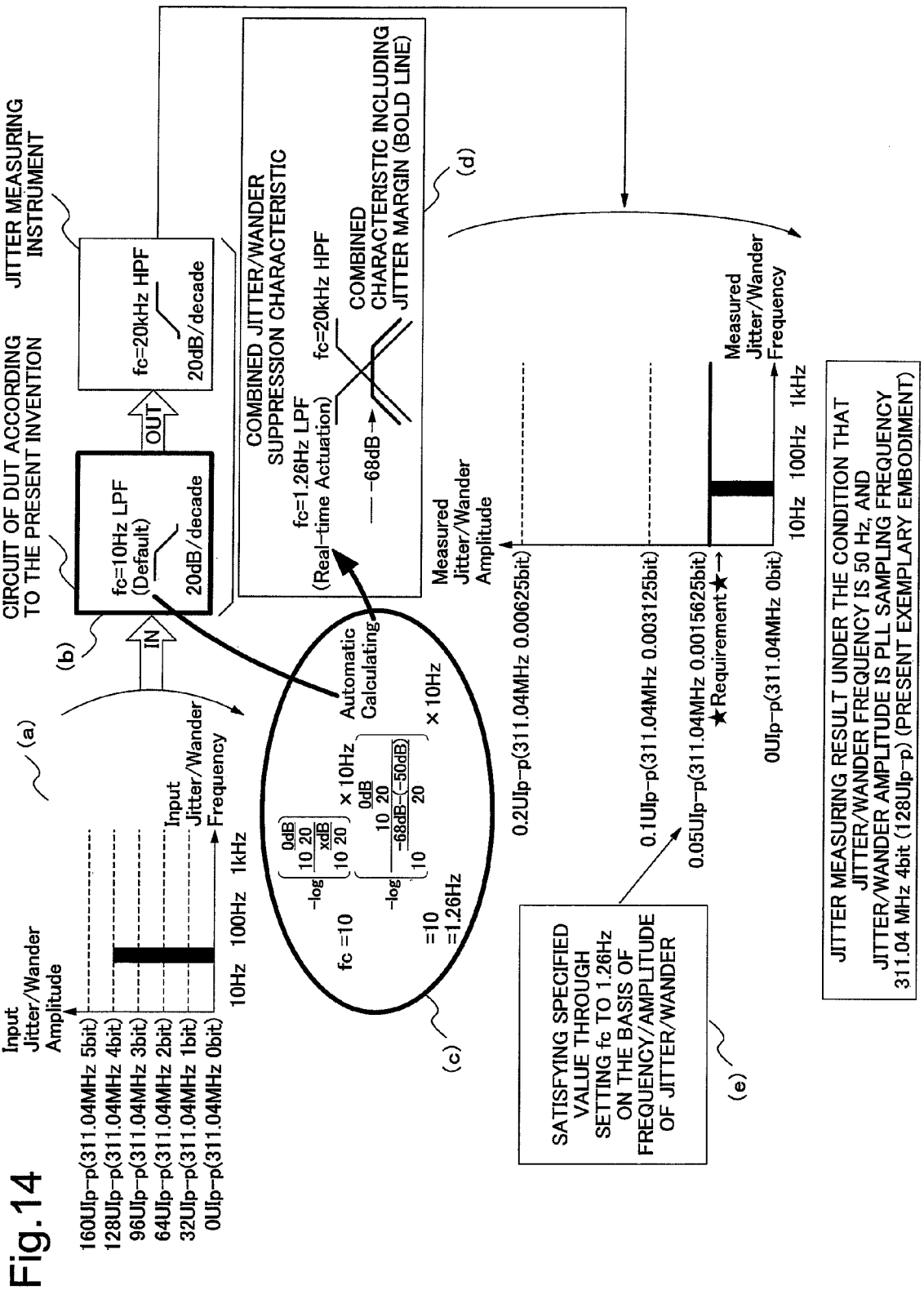
FIG. 14 is a second diagram to show a relation between the frequency and the amplitude of the input jitter, and the frequency and the amplitude of the output measured jitter of DUT (Device Under Test) according to the exemplary embodiment of the present invention.
Figure 15:
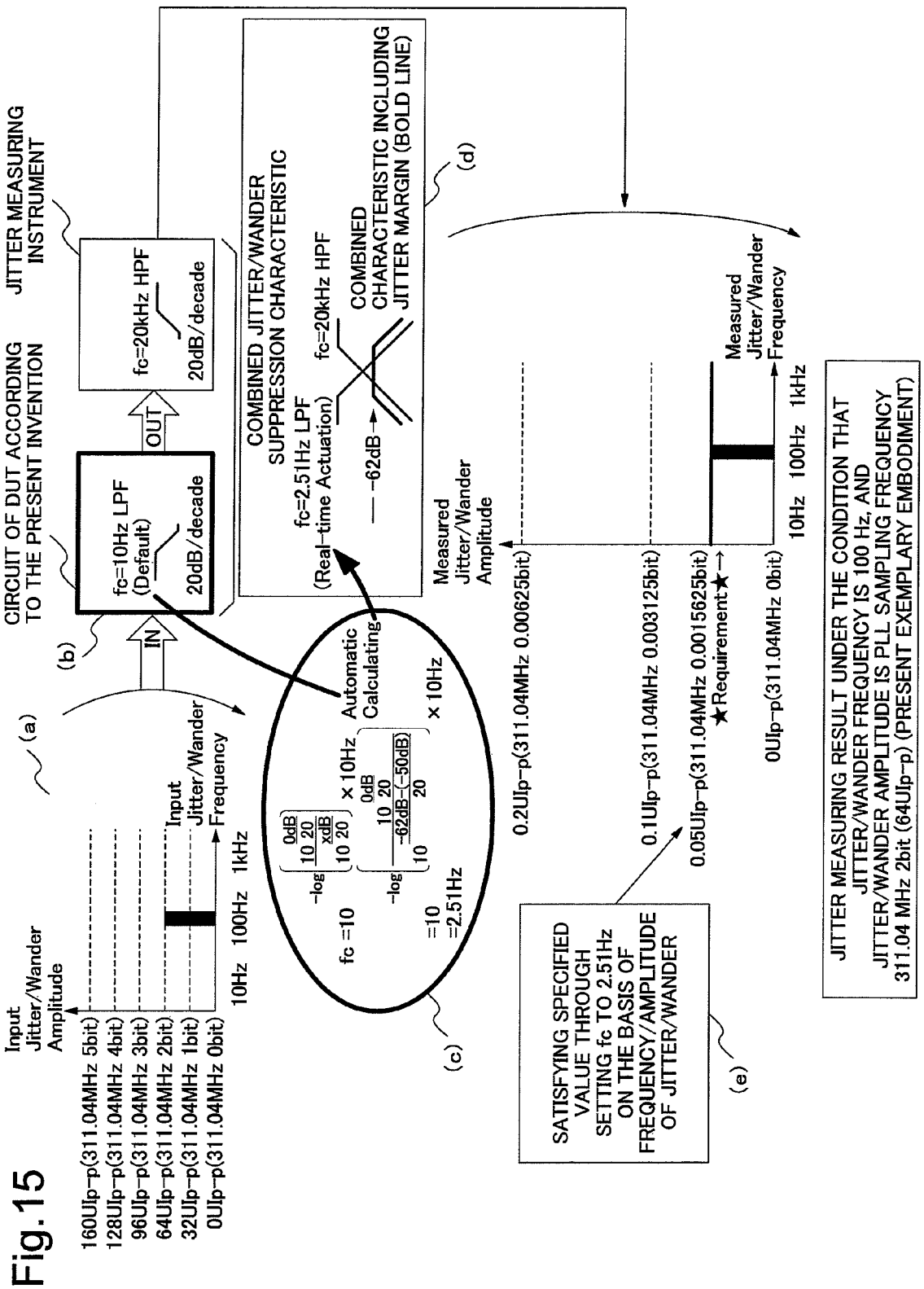
FIG. 15 is a third diagram to show a relation between the frequency and the amplitude of the input jitter, and the frequency and the amplitude of the output measured jitter of DUT (Device Under Test) according to the exemplary embodiment of the present invention.

FIGS. 13 to 15 are a first to a third diagrams respectively each of which shows a relation between frequency and amplitude of an input jitter, and frequency and amplitude of an output measured jitter of DUT (Device Under Test) according to the exemplary embodiment of the present invention.

In the following description, "default fc" means an initial value (10 Hz) of fc.

The specific example 1 shows a case that the jitter/wander frequency is 10 Hz and the jitter/wander amplitude is corresponding to the PLL sampling period 1 bit (32 UIp-p) (FIG. 13 (a)). In this case, in order to suppress the jitter/wander amplitude to be not larger than "0.05 UIp-p", since 20 Log (0.05/32)=approximately −56 dB, it is necessary to make the jitter/wander suppression performance not larger than "−56 dB".

FIG. 9 shows that the jitter/wander suppression level is 50 dB at 10 Hz. Accordingly, it is necessary to improve the jitter/wander suppression performance by 6 dB in order to make the jitter/wander suppression performance −56 dB since (−56 dB)−(−50 dB)=−6 dB. For this improvement, fc is changed to f1 by use of the formula 5 described later. In the specific example 1, f1=5 Hz is obtained through substituting −6 dB for V2 in the formula 6. Consequently, fc is changed from fc=10 Hz (default fc) to fc=5 Hz (FIGS. 13 (b) and (c)). Since fc of LPF is changed to fc=5 Hz, the jitter/wander suppression characteristic of −56 dB is obtained at the jitter/wander frequency of 10 Hz. In this case, the combined characteristic of the jitter/wander suppression is shown in FIG. 13 (d). As a result, the jitter/wander amplitude satisfies the request value of 0.05 UIp-p (FIG. 13 (e)).

The specific example 2 shows a case that the jitter/wander frequency is 50 Hz and the jitter/wander amplitude is corresponding to the PLL sampling period 4 bit (128 UIp-p) (FIG. 14 (a)). In this case, in order to suppress the jitter/wander amplitude to be not larger than "0.05 UIp-p", since 20 Log (0.05/128)=approximately −68 dB, it is necessary to make the jitter/wander suppression performance not larger than "−68 dB". Since (−68 dB)−(−50 dB)=−18 dB, it is necessary to improve the jitter/wander suppression performance by 18 dB. Similarly to the specific example 1, the default fc is changed from fc=10 Hz to fc=1.26 Hz by calculation of the formula 6 (FIGS. 14 (b) and (c)). Since fc of LPF is changed to fc=1.26 Hz, the jitter/wander suppression characteristic of −68 dB is obtained at the jitter/wander frequency of 50 Hz. In this case, the combined characteristic of the jitter/wander suppression is shown in FIG. 14 (d). As a result, the jitter/wander amplitude satisfies the request value of 0.05 UIp-p (FIG. 14 (e)).

The specific example 3 shows a case that the jitter/wander frequency is 100 Hz and the jitter/wander amplitude is corresponding to the PLL sampling period 2 bit (64 UIp-p) (FIG. 14 (a)). In this case, in order to suppress the jitter/wander amplitude to be not larger than "0.05 UIp-p", it is necessary to make the jitter/wander suppression performance not larger than "−62 dB" as a result of the same calculation as those of the specific examples 1 and 2.

In the case of the specific example 3, since (−62 dB)−(−50 dB)=−12 dB, the default fc is changed from fc=10 Hz to fc=2.51 Hz in order to improve the jitter/wander suppression performance (FIGS. 15 (b) and (c)). Since fc of LPF is changed to fc=2.51 Hz, the jitter/wander suppression characteristic of −62 dB is obtained at the jitter/wander frequency of 100 Hz. In this case, the combined characteristic of the jitter/wander suppression is shown in FIG. 15 (d). As a result, the jitter/wander amplitude satisfies the requested value of 0.05 UIp-p (FIG. 14 (e)).

By the above mentioned calculation, it is possible to satisfy 0.05 UIp-p which is the DUT internal specification on the jitter/wander amplitude.

$$-20\ dB/decade = [20\ LOG(V1/V2)]/[LOG(f1/f2)]$$
formula 5(known function)

The formula 5 indicates the slope of the jitter/wander suppression characteristic shown in FIG. 9 whose horizontal axis means frequency in the logarithmic scale, and vertical axis means amplitude in the logarithmic scale.

In the formula 5, −20 dB/decade means attenuation ratio of LPF at the frequency not lower than the cut-off frequency, and V1 and V2 mean the jitter/wander amplitude respectively, and f1 and f2 mean the jitter/wander frequencies respectively.

Accordingly, it is possible to calculate fc from the following formula 6 by specifying f1 from the formula 5 and by substituting 0 dB and 10 Hz for V1 and f2.

$$fc = f1 = 10^{\wedge}[-LOG((10^{\wedge}(0\ dB/20))/(10^{\wedge}(V2\ dB/20)))] \times 10\ Hz$$
formula 6

As mentioned above, the PLL Feed Forward Real-time Actuator unit 400 always calculates the optimum jitter/wander cut-off frequency by use of the formula 6 on the basis of the Jitter/Wander Information provided by the Jitter/Wander Detector unit 200. Then, the PLL Feed Forward Real-time Actuator unit 400 sets the amplifier gains, which are adaptive to the calculated jitter/wander cut-off frequency (fc), to the Digital Amp1 part 102 and the Digital Amp2 part 103. As a result, the PLL Feed Forward Real-time Actuator unit 400 can carry out the jitter/wander suppression in real time.

Since a process to calculate the amplifier gain on the basis of jitter/wander cut-off frequency (=fc) according to the exemplary embodiment is well known, specific description on the calculation process is omitted.

Furthermore, the PLL Feed Forward Real-time. Actuator unit 400 carries out the PLL control on the basis of the Frequency Change Information provided by the Frequency Change Slope Detector unit 300.

In order to make the PLL unit 100 track the frequency at high speed, the PLL Feed Forward Real-time Actuator unit 400 resets the Phase Detector part 101 of the PLL unit 100 on the basis of the Frequency Change Information. Moreover, the PLL Feed Forward Real-time Actuator unit 400 controls the amplifier gains of the Digital Amp1 part 102 and the Digital Amp2 part 103 of the PLL unit 100 in real time. As a result, it is possible that the PLL unit 100 tracks the frequency at the high speed.

An Integrator Reset signal is shown in FIG. 5. The signal has a function to make the PLL unit 100 track the frequency at the high speed in the case that the PLL unit 100 starts the operation by Power Up or the like.

Figure 16:
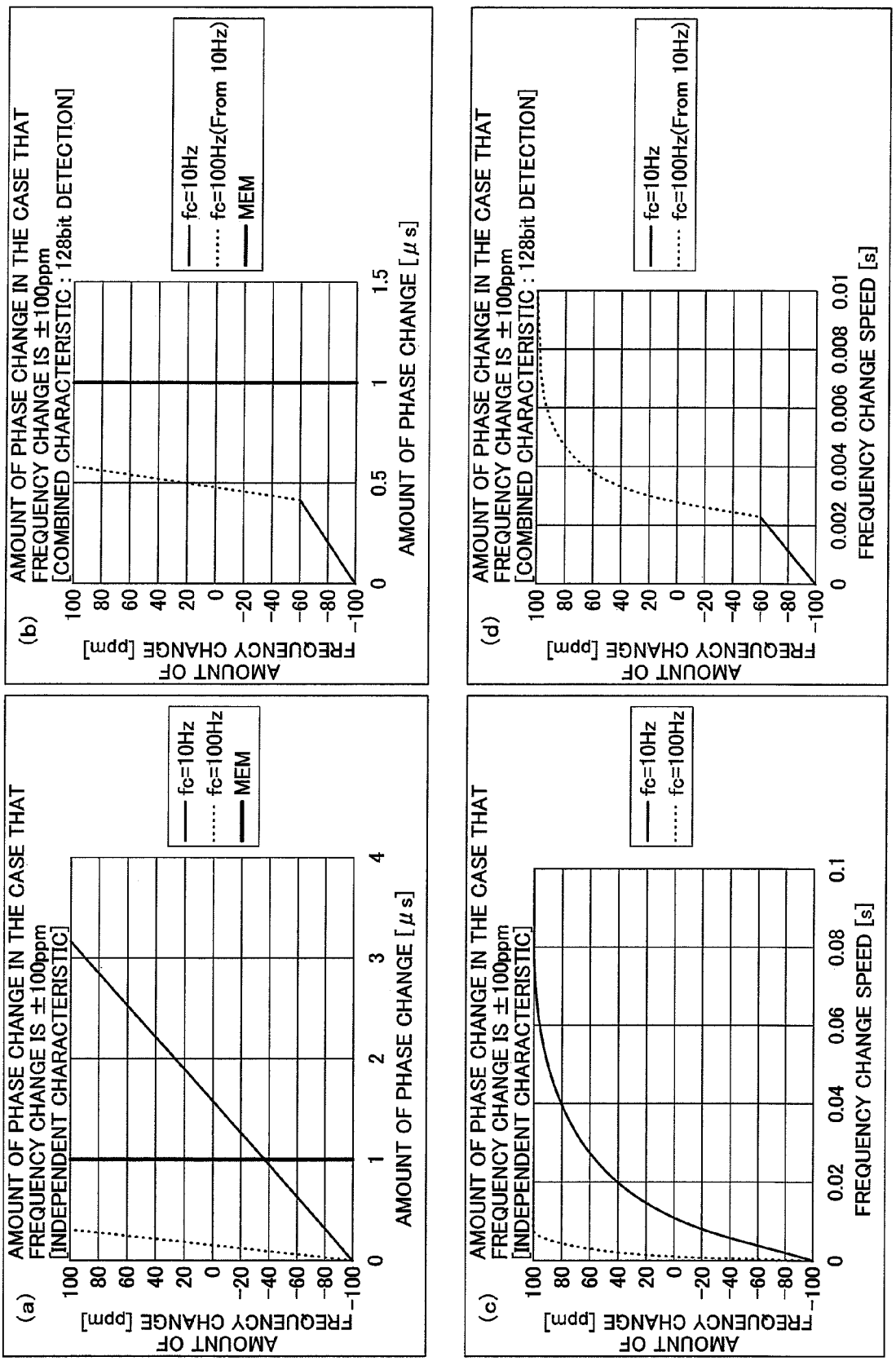
FIG. 16 shows a specific example of occurrence of a rapid frequency change.

FIG. 16 shows a specific case of occurrence of the rapid frequency change.

A solid line in FIG. 16 indicates a phase/frequency characteristic under the condition that the default frequency fc is 10 Hz.

In the case that the input frequency difference changes from −100 ppm to +100 ppm rapidly, an amount of phase change exceeds 1 μs which is the tolerable level determined on the basis of the OTN asynchronous staff memory capacity (MEM), and then causes a link failure. Therefore, the phase change threshold level is set to the Phase Threshold part 303 of the Frequency Change Slope Detector unit 300 in advance. Then, the Frequency Change Slope Detector unit 300 notifies the PLL Feed Forward Real-time Actuator unit 400 of the Frequency Change Information which indicates occurrence of the rapid frequency change in the case that the amount of phase change exceeds the phase change threshold level. When the PLL Feed Forward Real-time Actuator unit 400 receives the Frequency Change Information, the PLL Feed Forward Real-time Actuator unit 400 changes the amplifier gains of the Digital Amp1 part 102 and the Digital Amp2 part 103 of the PLL unit 100 in real time.

It is exemplified in FIG. 16 that the amount of frequency change is 200 ppm, the tolerable level of the phase change which is determined on the basis of the OTN asynchronous staff memory capacity is 1 μs, and a detection threshold level is 128 bit (311.04 MHz sampling).

The detection threshold level is set to be not smaller than 64 bits and to detect the rapid frequency change threshold level by use of about half of the memory capacity according to the ITU-T Jitter Tolerance Mask specification. These can be set automatically by the Automatic Phase/Frequency Detection Controller unit 500 mentioned later. According to an example shown in FIG. 16, fc is changed from 10 Hz to 100 Hz in the case that the amount of frequency change exceeds the frequency change threshold level. Actually, fc is calculated by use of the following formula.

$$[\text{Pull-in/Hold-in Range(ppm)}]/[\text{direct current loop gain}] = [\text{permissible amount of phase change determined by memory capacity}/2(\text{sec})] \quad \text{formula 7}$$

Here, Pull-in/Hold-in Range means a frequency pull-in range of the PLL unit 100.

$$fc = [\text{direct current loop gain}]/[2\pi] \quad \text{formula 8 (known function)}$$

The formula 7 and the formula 8 mentioned above introduce the following formula 9 to specify fc which is used at a time when the rapid frequency change occurs.

$$fc \geq [\text{Pull-in/Hold-in Range}]/[\text{memory capacity}/2]/[2\pi] \quad \text{formula 9.}$$

As a specific example, it is assumed that the Pull-in/Hold-in Range is 200 ppm and the memory capacity is 1 μs. In this case, if fc>=63.66 Hz, the high-speed tracking operation is possible with no memory slip even when the rapid frequency change occurs.

Figure 17:
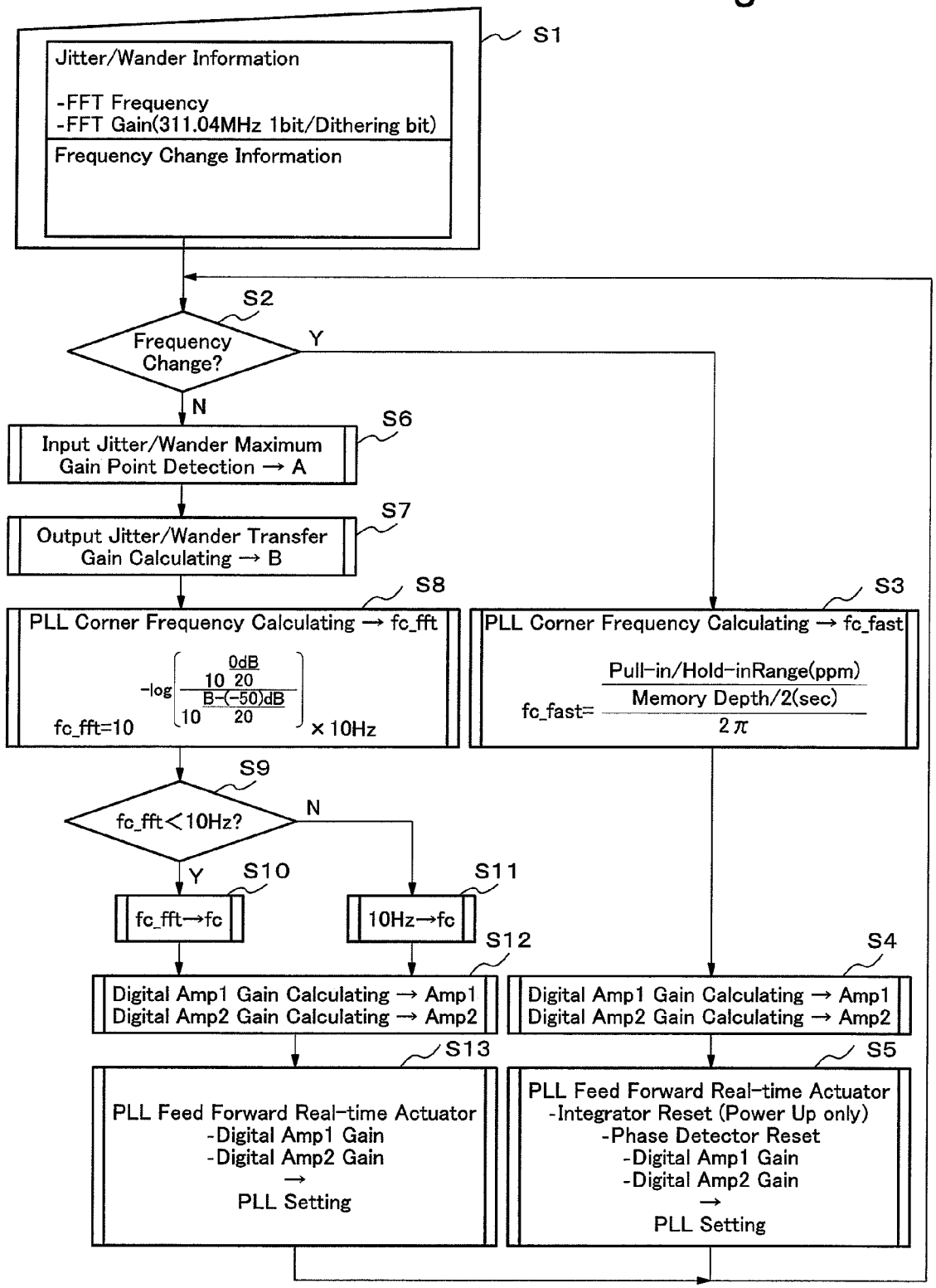
FIG. 17 shows an example of an operation of a PLL Feed Forward Real-time Actuator unit.

FIG. 17 shows an example of the operation of the PLL Feed Forward Real-time Actuator unit 400 (PLL Feed Forward Real-time Actuation Flow) described above.

The PLL Feed Forward Real-time Actuator unit 400 receives the Jitter/Wander Information from the Jitter/Wander Detector unit 200. Then, the PLL Feed Forward Real-time Actuator unit 400 receives the Frequency Change Information from the Frequency Change Slope Detector unit 300 (Step S1). FFT Frequency, FFT Gain (311.04 MHz 1 bit/Dithering bit) or the like is exemplified as the Jitter/Wander Information.

The PLL Feed Forward Real-time Actuator unit 400 judges on the basis of the Frequency Change Information whether the rapid frequency change occurred (Step S2). In the case that the rapid frequency change occurred (Yes in step S2), fc is calculated on the basis of the Pull-in/Hold-in Range (ppm) and Memory Depth/2 (sec) of DUT (Step S3).

The Memory Depth means memory capacity for converting the OTN signal into the SDH signal or the Ethernet signal.

Next, the PLL Feed Forward Real-time Actuator unit 400 calculates the amplifier gain adaptive to fc which is calculated in Step S3 (Step S4).

Next, the PLL Feed Forward Real-time Actuator unit 400 transmits an Integrator Reset and a Phase Detector Reset to the PLL unit 100. The Integrator Reset is a signal which resets the Integrator part 104. The Phase Detector Reset is a signal which resets the Phase Detector part 101. Moreover, the PLL Feed Forward Real-time Actuator unit 400 transmits an Amp1 Parameter and an Amp2 Parameter to the PLL unit 100 and sets Amp1 and Amp2 to the Digital Amp1 part 102 and the Digital Amp2 part 103 as the amplifier gain respectively (Step S5).

The Integrator Reset is carried out only at a time when an electric power supply of the PLL unit 100 is turned on.

The PLL Feed Forward Real-time Actuator unit 400 gives priority to judging whether the rapid frequency change occurs in Step S2. As a result, it is possible to prevent the actual link failure due to the rapid frequency change.

In the case that there is no rapid frequency change (No in Step S2), the PLL Feed Forward Real-time Actuator unit 400 detects the maximum amplitude value (A) out of the jitter/wander of all FFT points (Step S6).

Next, the PLL Feed Forward Real-time Actuator unit 400 calculates the jitter/wander suppression gain (B) which is needed to cope with the maximum amplitude value (A) detected in Step S6 (Step S7).

Next, the PLL Feed Forward Real-time Actuator unit 400 calculates the jitter/wander cut-off frequency fc on the basis of the information calculated in Step S7, where the calculated jitter/wander cut-off frequency is denoted as fc_fft (Step S8).

The calculation of fc is carried out by use of the formula 6 as been already described.

Next, in the case that fc_fft which is calculated in Step S8 is not lower than 10 Hz (No in Step S9), it is not necessary to raise fc, and consequently the PLL Feed Forward Real-time Actuator unit 400 does not update the present value of fc (10 Hz->fc; Step S11). In the case that fc which is calculated in Step S8 is lower than 10 Hz (Yes in Step S9), the PLL Feed Forward Real-time Actuator unit 400 updates fc (Step S10).

Next, the PLL Feed Forward Real-time Actuator unit 400 calculates the amplifier gain adaptive to fc information (Step S12).

Next, the PLL Feed Forward Real-time Actuator unit 400 sets Amp1 and Amp2 to the Digital Amp1 part 102 and the Digital Amp2 part 103 respectively as the amplifier gain (Step S13).

As described above, the PLL circuit according to the exemplary embodiment can suppress the wander component, which could not be predicted in the past, such as the cascade wander which may be generated in the multistage connection, without using an expensive device such as the oven-controlled crystal oscillator.

<Operation of Second Control Circuit; Automatic Phase/Frequency Detection Controller Unit 500>

The Automatic Phase/Frequency Detection Controller unit 500, which is a second control circuit, has a function to optimize operations in the Jitter/Wander Detector unit 200 and the Frequency Change Slope Detector unit 300 automatically.

Figure 18:
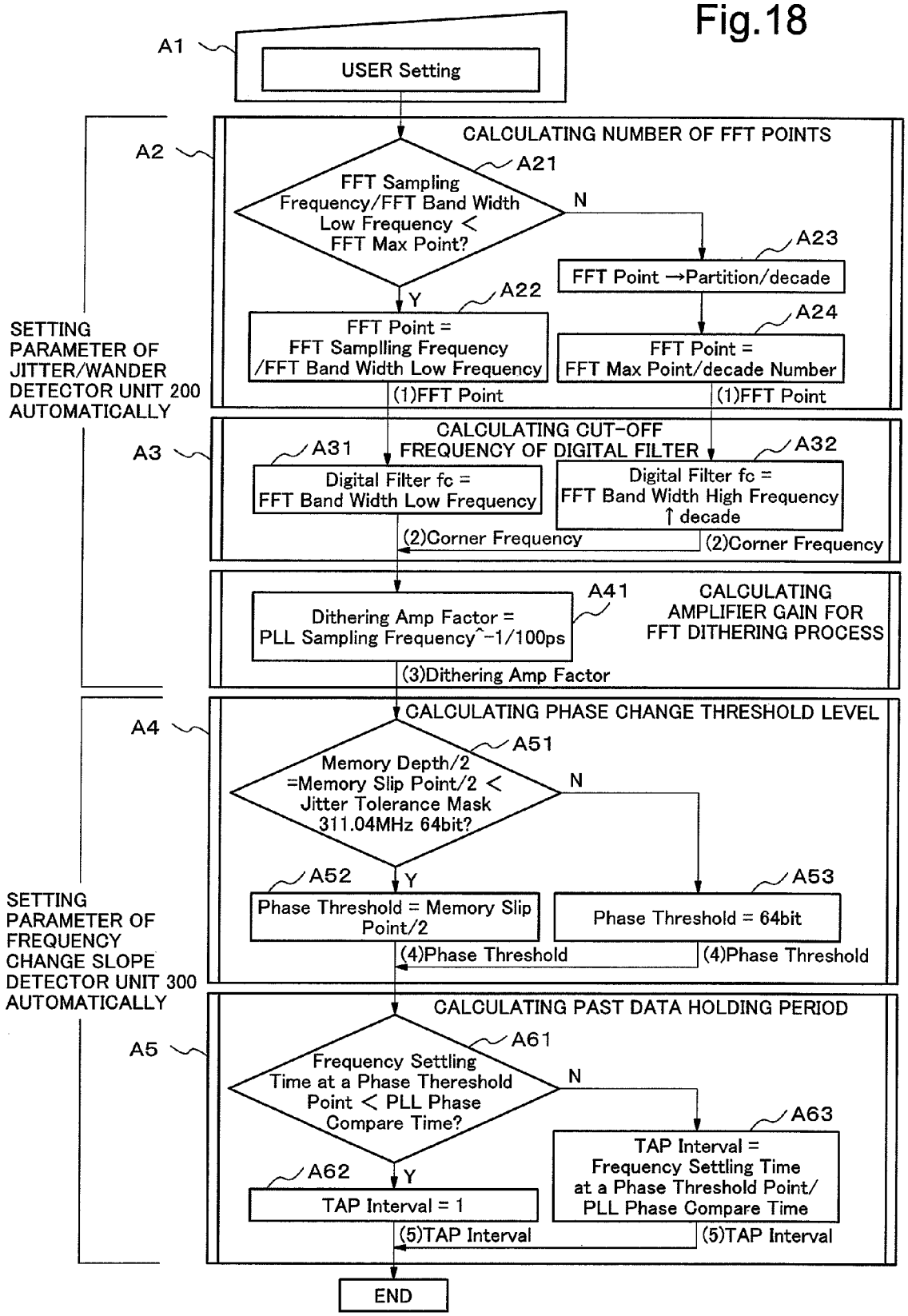
FIG. 18 shows an example of an operation of an Automatic Phase/Frequency Detection Controller unit.

FIG. 18 shows an example of the operation of the Automatic Phase/Frequency Detection Controller unit 500 (Automatic Phase/Frequency Detection Control Flow).

The Automatic Phase/Frequency Detection Controller unit 500, into which each user setting data (USER Setting) is inputted (Step A1), carries out a process to calculate number of FFT points on the basis of each inputted user setting data (Step A2). The following information is exemplified as the user setting data.

Phase comparing method (e.g. EX-OR, SR-FF and D-FF etc.)
Phase comparison frequency (Hz)
PLL sampling frequency (Hz)
VCO variable characteristic (ppm/V)
VCO APR (ppm)
Pull-in/Hold-in Range (ppm)
Memory Depth (sec)
FFT Frequency Band Width
FFT Sampling Frequency
FFT Maximum Point Meaning of each user setting data (USER Setting) is as follows. The phase comparing method means a circuit type of the phase comparator. The phase comparison frequency means number of times of the phase comparison per second carried out in the Phase Detector part 101. The PLL sampling frequency means number of times of sampling the phase difference in one second. The VCO variable characteristic means frequency conversion gain of VCO, and VCO APR (Absolute Pulling Range) means an absolute frequency variable range of VCO. The Pull-in/Hold-in Range means a frequency pull-in range of PLL. The Memory Depth means memory capacity for converting the OTN signal into the SDH signal or the Ethernet signal. The FFT Frequency Band Width means a frequency range in which the FFT analysis is carried out. The FFT Sampling Frequency means number of times of sampling the frequency information, which is also the phase difference information, per one second. The FFT Maximum Point means the maximum number of FFT points.

Moreover, "Frequency Settling Time at a Phase Threshold Point" in Step A6 of FIG. 18 means a PLL pull-in time, that is, a time until the frequency is pulled-in to the phase change threshold level. This time indicates a time for shifting from a phase before the frequency change to a phase after the frequency change. In order to calculate the value, information of the phase comparing method, the phase comparison frequency, the PLL sampling frequency, the VCO variable characteristic and VCO APR is used.

In Step A2 of FIG. 18, information of the FFT Frequency Band Width, the FFT Sampling Frequency and the FFT Maximum Point is used.

In Step A5 of FIG. 18, information of the Memory Depth is used.

According to the exemplary embodiment, it is assumed that each user setting data is set as follows:

Phase comparing method is D-FF;
Phase comparison frequency (Hz) is 100 kHz;
PLL sampling frequency (Hz) is 311.04 MHz;
VCO variable characteristic (ppm/V) is 100 ppm/1V;
VCO APR (ppm) is 150 ppm;
Pull-in/Hold-in Range (ppm) is ±100 ppm;
Memory Depth (sec) is 1 µs;
FFT Frequency Band Width is 1 Hz to 1 kHz;
FFT Sampling Frequency is 10 kHz; and
FFT Maximum Point are 500 points.

<Step A2; Calculation of Number of FFT Points>

In the following description, FFT Band Width Low Frequency means the lowest frequency within the frequency range in which the FFT analysis is carried out. FFT Band Width High Frequency means the highest frequency within the frequency range in which the FFT analysis is carried out.

Moreover, FFT Point means number of points at which the FFT analysis is carried out. Decade Number means number of the divided FFT bands.

First, the Automatic Phase/Frequency Detection Controller unit 500 judges whether the user setting data satisfies the following formula (Step A21).

FFT Sampling Frequency/FFT Band Width Low Frequency<FFT Max Point

In the case that the user setting data satisfies the above-mentioned formula (Yes in Step A21), the Automatic Phase/Frequency Detection Controller unit 500 sets the FFT Point to FFT sampling Frequency/FFT Band Width Low Frequency (Step A22).

On the other hand, in the case that the user setting data does not satisfy the above-mentioned formula (No in Step A21), the Automatic Phase/Frequency Detection Controller unit 500 divides the FFT frequency range per each decade. Then, number of FFT points per each decade is defined as the FFT Point (Step A23).

FFT Point->Partition/decade

Then, the Automatic Phase/Frequency Detection Controller unit 500 determines the FFT Point through calculating FFT Max Point/decade Number (Step A24).

For example, in the case that the FFT frequency range is 1 Hz to 1 kHz, and the FFT sampling frequency is 10 kHz, the number of FFT points is usually 10 kHz/1 Hz=10000 points. However, in the case that number of the FFT maximum points is limited to 500 because of a problem of FFT analytical capability, it is impossible to carry out the FFT analysis by use of expected number of points (No in Step A21). In this case, the FFT frequency is divided in a frequency Decade unit (Step A23). In this case, the FFT frequency range is divided into three bands of 1 Hz to 10 Hz, 10 Hz to 100 Hz and 100 Hz to 1 kHz.

The actual number of FFT points can be calculated to be 500 points/3 divided bands=166 points (Step A24). Because the number of FFT points is generally power of 2, the FFT analysis is carried out with 128 points×three divided bands.

Next, the Automatic Phase/Frequency Detection Controller unit 500 calculates a cut-off frequency (fc) of a Digital Filter for the FFT analysis (Step A3).

<Step 3; Calculation of Cut-Off Frequency of Digital Filter>

In the case that FFT sampling Frequency/FFT Band Width Low Frequency is smaller than the FFT Max Point in Step A21 (Yes in Step A21), the Automatic Phase/Frequency Detection Controller unit 500 sets the Digital Filter fc to the FFT Band Width High Frequency (Step A31).

On the other hand, in the case that FFT sampling Frequency/FFT Band Width Low Frequency is not smaller than the FFT Max Point in Step A21 (No in Step A21), the frequency band, in which the FFT analysis is carried out, is divided. Then, the FFT Band Width High Frequency which is the highest frequency of each divided FFT analysis band is set to the Digital Filter fc (Step A32).

For example, in the case that the FFT frequency range is 100 Hz to 1 kHz, and the FFT sampling frequency is 10 kHz, and number of FFT maximum points is 500, the number of FFT points is 100. For this reason, the cut-off frequency is 1 kHz which is the high frequency in the FFT frequency range (Step A31).

Moreover, in the case that the FFT frequency range is 1 Hz to 1 kHz, and the FFT sampling frequency is 10 kHz, and number of FFT maximum points is 500, the number of FFT points is 128 points×three divided bands as mentioned above. For this reason, 1 kHz, 100 Hz and 10 Hz, which are the highest frequencies of the divided FFT frequency band respectively, are determined as the cut-off frequency (Step A32).

Next, the Automatic Phase/Frequency Detection Controller unit 500 calculates amplifier gain for the dithering process in order to make the FFT analysis more precise (Step A4).

<Step 4; Calculation of Amplifier Gain for FFT Dithering Process>

The Automatic Phase/Frequency Detection Controller unit 500 sets Dithering Amp Factor to (1/PLL Sampling Frequency)×(1/100 ps) (Step A41).

The Dithering Amp Factor means amplifier gain of the Dithering Amp1 part 201.

In the case of processing the jitter of 10 Gbps, it is usually necessary that the process is carried out with precision of "100 ps (10 Gbps 1bit resolution)" at least, while the precision of the process depends on the expected precision for detecting the jitter/wander. For this reason, it is necessary to process the amplitude of the jitter/wander through carrying out the dithering processing so that the PLL sampling period may be 100 ps equivalently.

The actual Dithering Amp1 part 201 of the Jitter/Wander Detector unit 200 multiplies the amplitude of the jitter/wander by the amplifier gain of the Dithering Amp1 part 201, and the Dithering Amp 2 part 205 divides the amplitude of the jitter/wander by the amplifier gain of the Dithering Amp 2 part 205 reversely. For example, in the case that the PLL sampling period is 3.2 ns, the dithering process that the Dithering Amp1 part 201 multiplies the amplitude of the jitter/wander by 32 (=3.2 ns/100 ps), and that the Dithering Amp2 part 205 multiplies the amplitude of the multiplied jitter/wander by 1/32 is performed.

Next, the Automatic Phase/Frequency Detection Controller unit 500 calculates the phase change threshold level for detecting the frequency change (step A5).

<Step A5; Calculation of Phase Change Threshold Level>

Hereinafter, Memory Slip Point means a phase difference which causes the memory slip and is equal to the Memory Depth. The Jitter Tolerance Mask 311.04 MHz 64 bit, which is specified by ITU-T, means the frequency change threshold level under the condition that the PLL sampling frequency is 311.04 MHz. It is assumed that the threshold level is corresponding to half of the memory capacity in consideration of the high tracking speed which is applied after detecting the phase change threshold level. However, the threshold level is set to be not smaller than 64 bits of 311.04 MHz, which is the largest jitter amplitude out of the Jitter Tolerance Mask specified in the international recommendation, so that the input jitter component may not be detected falsely as the rapid frequency change state.

First, the Automatic Phase/Frequency Detection Controller unit 500 judges whether the following formula is satisfied (Step A51).

Memory Depth/2=Memory Slip Point/2<Jitter Tolerance Mask 311.04 MHz 64 bit

In the case that the formula is satisfied (Yes in Step A51), the Automatic Phase/Frequency Detection Controller unit 500 sets the Phase Threshold to be Memory Slip Point/2 (Step A52).

On the other hand, in the case that the formula is not satisfied (No in Step A51), the Phase Threshold is set to be 64 bit (Step A53).

Next, the Automatic Phase/Frequency Detection Controller unit 500 calculates a past data holding period for detecting the rapid frequency change (Step A6).

<Step A6; Calculation of Past Data Holding Period>

First, the Automatic Phase/Frequency Detection Controller unit 500 judges whether the following formula is satisfied (Step A61). PLL Phase Compare Time, which means a phase comparison period, is a reciprocal of the phase comparison frequency. Moreover, TAP Interval is number of TAPs for holding the past data.

Frequency Settling Time at a Phase Threshold Point<PLL Phase Compare Time

In the case that the above formula is satisfied (Yes in Step A61), the Automatic Phase/Frequency Detection Controller unit 500 sets the TAP Interval to 1 (TAP Interval=1; Step A62).

On the other hand, in the case that the formula is not satisfied (No in Step A61), the Automatic Phase/Frequency Detection Controller unit 500 sets the TAP Interval to Frequency Settling Time at a Phase Threshold Point/PLL Phase Compare Time (TAP Interval=Frequency Settling Time at a Phase Threshold Point/PLL Phase Compare Time; Step A54).

According to a rapid frequency change detecting method of the exemplary embodiment, past data provided by the TAP part 301 which can hold phase data, and present data provided by the PLL unit 100 are compared each other at every PLL phase comparison period. However, depending on a certain PLL phase comparison period, it is impossible to detect the rapid frequency change if a time for the phase change due to the rapid frequency change is short. This is because the rapid frequency change synchronizes seemingly with the wander. Accordingly, it is necessary to secure number of TAPs, which is corresponding to the frequency pull-in time, in order to hold the past data.

For example, in the case that the phase comparison frequency is 100 kHz (=10 μs), and the pull-in time until the phase change threshold level is about 2 ms, the number of TAPs is required to be not smaller than 200 (=2 ms/10 μs).

Here, since the number of TAPs is a natural number, in the case that the above-mentioned division is indivisible, it is enough to make the number of TAPs an integer which is obtained through rounding up decimal places of the result of the division.

<Work and Effect of PLL Circuit According to First Exemplary Embodiment>

As mentioned above, the PLL circuit according to the exemplary embodiment detects and processes the jitter/wander component and the rapid frequency change state on the basis of the phase comparison data of the PLL unit 100 in real time, and controls the loop gain of the PLL unit 100 on the basis of a result of the process. As a result, the PLL circuit can realize the high-speed frequency tracking performance while satisfying the jitter/wander suppressing performance, which is originally in the trade-off relation with the frequency tracking performance.

Moreover, the PLL circuit according to the first exemplary embodiment does not detect the zero staff jitter by frequency monitoring of the SDH signal or the like but detects the jitter/wander component in real time on the basis of the phase comparison data of the PLL unit 100 by use of the FFT analysis and processes the detected jitter/wander. Then, the PLL circuit according to the first exemplary embodiment makes the operation of the PLL unit 100 reflect the result of processing the jitter/wander component in real time, and consequently suppresses the jitter/wander. As a result, the PLL circuit according to the first exemplary embodiment can realize the system with low cost.

Moreover, the PLL circuit according to the first exemplary embodiment does not predict occurrence of the cascade wander, but detects the jitter/wander component in real time on the basis of the phase comparison data of the PLL unit 100 by use of the FFT analysis to process the detected jitter/wander component, and makes the operation of the PLL unit 100 reflect the result of the process. As a result, the PLL circuit according to the first exemplary embodiment can suppress the cascade wander.

Moreover, the PLL circuit according to the first exemplary embodiment detects the frequency change state in real time on the basis of the phase comparison data of the PLL unit 100 to process the detected frequency change state. Then, the PLL circuit according to the exemplary embodiment can secure the frequency tracking performance through making the PLL unit 100 reflect the result in real time.

Here, the first exemplary embodiment mentioned above describes one of the preferred exemplary embodiments of the present invention. Moreover, the present invention is not limited only to the exemplary embodiment mentioned above, and can carry out an embodiment in which various changes in form and details are made without departing from the spirit and scope of the present invention.

For example, a control operation of each of the units 100, 200, 300, 400 and 500 which compose the PLL circuit shown in FIG. 5 mentioned above can be carried out by use of hardware, software or a combination of the hardware and the software.

In the case that the processes are carried out by use of software, it is possible to install a program, which records a sequence of the processes, in a memory of a computer which is mounted on a dedicated hardware, and to execute the program.

Or, it is possible to install the program in a general-purpose computer, which can carry out various processes, and to execute the program.

For example, it is possible to record the program beforehand in a hard disk and ROM (Read Only Memory) which are recording media. Or, it is possible to store (record) the program in a removable recording medium temporarily or permanently. It is possible to provide the removable recording medium as so-called packaged software. Here, a floppy (registered trademark) disk, CD-ROM (Compact Disc Read Only Memory), a MO (Magneto optical) disk, DVD (Digital Versatile Disc), a magnetic disk and a semiconductor memory are exemplified as the removable recording medium.

The program is installed in the computer from the removable recording medium mentioned above. Or, the program is transferred from a download site through a wireless link. Or, the program is transferred through a wired link via a network.

While it is exemplified that the PLL circuit according to the first exemplary embodiment has the configuration which includes the first loop and the second loop, it may be preferable that the circuit according to the present invention is applied to a PLL circuit which has a configuration different from one according to the exemplary embodiment of the present invention.

While the PLL circuit according to the first exemplary embodiment carries out the processes mentioned above sequentially, it is also possible that the PLL circuit is configured so that the PLL circuit may carry out the processes in parallel or separately on the basis of processing capability of an apparatus which carries out the processes, or on the basis of necessity.

Figure 19:
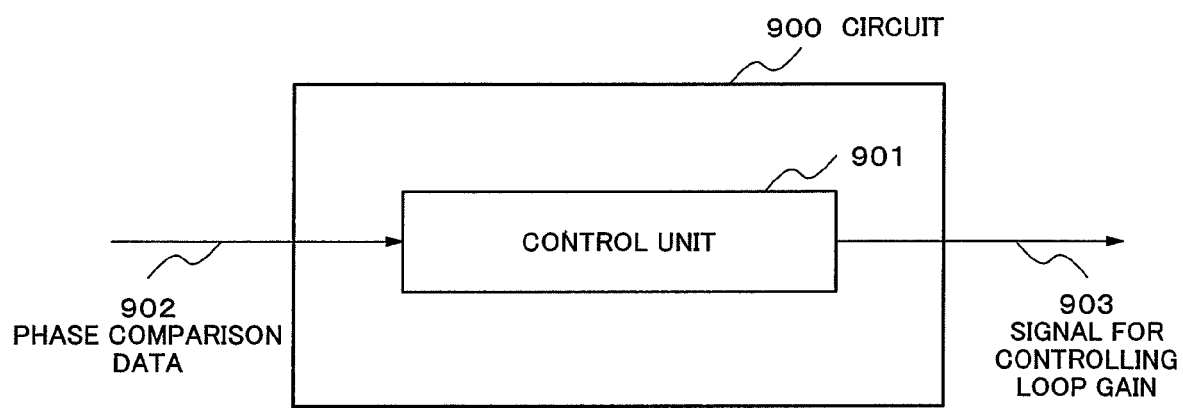
FIG. 19 shows a configuration of a circuit according to a second exemplary embodiment of the present invention.

FIG. 19 shows a configuration of a circuit according to a second exemplary embodiment of the present invention.

A circuit 900 shown in FIG. 19 includes a control unit 901. A PLL unit which is not shown in the figure regenerates a clock signal of an SDH signal or an Ethernet signal from an OTN signal.

The control unit 901 processes a jitter/wander component and a frequency change state on the basis of phase comparison data 902 which is provided by the PLL unit not shown in the figure. Then, the control unit 901 outputs a signal 903 for controlling loop gain of the PLL unit, which is not shown in the figure, on the basis of a result of the process.

That is, the control unit 901 of the circuit 900 according to the second exemplary embodiment is provided with the phase comparison data 902 of the PLL unit which regenerates the clock signal of the SDH signal or the Ethernet signal from the OTN signal. Then, the control unit 901 detects the jitter/wander component and the rapid frequency change state in real time on the basis of the inputted phase comparison data 902 to process the detected jitter/wander component and the detected rapid frequency change state. Moreover, the control unit 901 outputs the signal 903 for controlling the loop gain of the PLL unit on the basis of a result of the process. As a result, the circuit according to the second exemplary embodiment can output a control signal which makes the high-speed frequency tracking performance realized while satisfying the jitter/wander suppressing performance the same time, which is originally in the trade-off relation with the frequency tracking performance.

While the invention has been particularly shown and described with reference to the first and second exemplary embodiments thereof, the invention is not limited to these embodiments. It will be understood by those of ordinary skill in the art that various changes in form and details may be made therein without departing from the spirit and scope of the present invention.

This application is based upon and claims the benefit of priority from Japanese Patent Application No. 2009-070347, filed on Mar. 23, 2009, the disclosure of which is incorporated herein in its entirety by reference.

DESCRIPTION OF A CODE

100 PLL unit
200 Jitter/Wander Detector unit 200
300 Frequency Change Slope Detector unit
400 PLL Feed Forward Real-time Actuator unit
500 Automatic Phase/Frequency Detection Controller unit
101 Phase Detector part
102 Digital Amp1 part
103 Digital Amp2 part
104 Integrator part
105 ADDER part
106 DAC part
107 VCO part
108 Divider part
201 Dithering Amp1 part
202 Digital Filter part
203 FFT processing part
204 Absolute part
205 Dithering Amp2 part
301 TAP part
302 Compare part
303 Phase Threshold part
900 Circuit according to the second exemplary embodiment
901 Control unit
902 Phase comparison data
903 Signal for controlling loop gain

The invention claimed is:

1. A circuit, comprising:
a control unit to control loop gain of a PLL (Phase Locked Loop) unit, which regenerates a clock signal of a SDH (Synchronous Digital Hierarchy) signal or an Ethernet signal from an OTN (Optical Transport Network) signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein
the Jitter/Wander Detector unit carries out a dithering process to multiply the phase comparison data by n (n is predetermined number not smaller than two), and to multiply the multiplied phase comparison data by 1/n after a FFT (Fast Fourier Transform) process.

2. The circuit according to claim 1, wherein
the Jitter/Wander Detector unit carries out the FFT process with dividing a frequency band into a predetermined frequency band.

3. The circuit according to claim 1, wherein
the Frequency Change Slope Detector unit calculates an amount of phase change on the basis of the phase comparison data, and judges whether the amount of phase change is not smaller than a threshold level, and creates frequency change information, which indicates that a frequency change occurred, in the case that the amount of phase change is not smaller than the threshold level.

4. The circuit according to claim 1, wherein the PLL Feed Forward Real-time Actuator unit calculates a cut-off frequency on the basis of the frequency change information, and on the basis of Pull-in/Hold-in Range and Memory Depth of DUT (Device Under Test) in the case that a frequency change exists, and sets amplifier gain, which is adaptive to the calculated cut-off frequency, to the PLL unit, and controls the loop gain of the PLL unit.

5. The circuit according to claim 1, wherein the PLL Feed Forward Real-time Actuator unit calculates the cut-off frequency on the basis of the frequency change information, and on the basis of the jitter/wander information in the case that the frequency change does not exist, and sets the amplifier gain, which is corresponding to the calculated cut-off frequency, to the PLL unit, and controls the loop gain of the PLL unit.

6. The circuit according to claim 5, wherein in the case that the cut-off frequency is not lower than a predetermined frequency, the PLL Feed Forward Real-time Actuator unit changes the cut-off frequency to the predetermined frequency, and sets the amplifier gain, which is adaptive to the predetermined frequency, to the PLL unit, and wherein in the case that the cut-off frequency is lower than the predetermined frequency, the PLL Feed Forward Real-time Actuator unit sets the amplifier gain, which is adaptive to the cut-off frequency, to the PLL unit.

7. The circuit according to claim 1, comprising: an Automatic Phase/Frequency Detection Controller unit which sets a control parameter used by the Jitter/Wander Detector unit, and a control parameter used by the Frequency Change Slope Detector unit.

8. A PLL circuit, comprising: the circuit which is described in claim 1; and a PLL unit which regenerates the clock signal of the SDH signal or the Ethernet signal from the OTN signal.

9. A circuit, comprising:
a control unit to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein
the PLL Feed Forward Real-time Actuator unit calculates a cut-off frequency on the basis of the frequency change information, and on the basis of Pull-in/Hold-in Range and Memory Depth of DUT (Device Under Test) in the case that a frequency change exists, and sets amplifier gain, which is adaptive to the calculated cut-off frequency, to the PLL unit, and controls the loop gain of the PLL unit.

10. A circuit, comprising:
a control unit to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein
the PLL Feed Forward Real-time Actuator unit calculates a cut-off frequency on the basis of the frequency change information, and on the basis of the jitter/wander information in the case that a frequency change does not exist, and sets amplifier gain, which is adaptive to the calculated cut-off frequency, to the PLL unit, and controls the loop gain of the PLL unit.

11. A control system, comprising:
a control unit to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein
the Jitter/Wander Detector unit carries out a dithering process to multiply the phase comparison data by n(n is predetermined number not smaller than two), and to multiply the multiplied phase comparison data by 1/n after a FFT process.

12. A control system, comprising:
a control unit to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein the PLL Feed Forward Real-time Actuator unit calculates a cut-off frequency on the basis of the frequency change information, and on the basis of Pull-in/Hold-in Range and Memory Depth of DUT (Device Under Test) in the case that a frequency change exists, and sets amplifier gain, which is adaptive to the calculated cut-off frequency, to the PLL unit, and controls the loop gain of the PLL unit.

13. A control system, comprising:
a control unit to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, wherein
the control unit includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL unit on the basis of the jitter/wander information and the frequency change information, and wherein
the PLL Feed Forward Real-time. Actuator unit calculates a cut-off frequency on the basis of the frequency change information, and on the basis of the jitter/wander information in the case that a frequency change does not exist, and sets amplifier gain, which is adaptive to the calculated cut-off frequency, to the PLL unit, and controls the loop gain of the PLL unit.

14. A control method to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, comprising:
processing the jitter/wander component and creating jitter/wander information; processing the frequency change state and creating frequency change information;
controlling the loop gain of the PLL unit on the basis of the jitter/wander information and the frequency change information; and
carrying out a dithering process to multiply the phase comparison data by n(n is predetermined number not smaller than two), and to multiply the multiplied phase comparison data by 1/n after a FFT process.

15. A control method to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, comprising:
processes processing the jitter/wander component and creating jitter/wander information;
processes processing the frequency change state and creating frequency change information;
controls controlling the loop gain of the PLL unit on the basis of the jitter/wander information and the frequency change information; and
calculates calculating a cut-off frequency on the basis of the frequency change information, and on the basis of Pull-in/Hold-in Range and Memory Depth of DUT (Device Under Test) in the case that a frequency change exists, and sets setting amplifier gain, which is adaptive to the calculated cut-off frequency, to the PLL unit, and controls the loop gain of the PLL unit.

16. A control method to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, comprising:
processing the jitter/wander component and creating jitter/wander information;
processing the frequency change state and creating frequency change information; controlling the loop gain of the PLL unit on the basis of the jitter/wander information and the frequency change information; and
calculating a cut-off frequency on the basis of the frequency change information, and on the basis of the jitter/wander information in the case that a frequency change does not exist, and setting amplifier gain, which is adaptive to the calculated cut-off frequency, to the PLL unit, and controlling the loop gain of the PLL unit.

17. A non-transitory computer-readable recording medium, wherein
the computer-readable recording medium records a program which makes a computer execute a process to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, and wherein
the program makes the computer execute a process of:
processing the jitter/wander component and creating jitter/wander information;
processing the frequency change state and creating frequency change information; controlling the loop gain of the PLL unit on the basis of the jitter/wander information and the frequency change information; and
carrying out a dithering process to multiply the phase comparison data by n(n is predetermined number not smaller than two), and to multiply the multiplied phase comparison data by 1/n after a FFT process.

18. A non-transitory computer-readable recording medium, wherein
the computer-readable recording medium records a program which makes a computer execute a process to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, and wherein
the program makes the computer execute a process of:
processing the jitter/wander component and creates jitter/wander information;
processing the frequency change state and creating frequency change information;
controlling the loop gain of the PLL unit on the basis of the jitter/wander information and the frequency change information; and
calculating a cut-off frequency on the basis of the frequency change information, and on the basis of Pull-in/Hold-in Range and Memory Depth of DUT (Device Under Test) in the case that a frequency change exists, and setting amplifier gain, which is adaptive to the calculated cut-off frequency, to the PLL unit, and controlling the loop gain of the PLL unit.

19. A non-transitory computer-readable recording medium, wherein
the computer-readable recording medium records a program which makes a computer execute a process to control loop gain of a PLL unit, which regenerates a clock signal of a SDH signal or an Ethernet signal from an OTN signal, on the basis of a result of processing a jitter/wander component and a frequency change state on the basis of phase comparison data of the PLL unit, and wherein
the program makes the computer execute a process of:
processing the jitter/wander component and creating jitter/wander information;
processing the frequency change state and creating frequency change information; controlling the loop gain of the PLL unit on the basis of the jitter/wander
information and the frequency change information; and
calculating a cut-off frequency on the basis of the frequency change information, and on the basis of the jitter/wander information in the case that a frequency change does not exist, and setting amplifier gain, which is adaptive to the calculated cut-off frequency, to the PLL unit, and controlling the loop gain of the PLL unit.

20. A circuit, comprising:
a control means for controlling loop gain of a PLL means, which regenerates a clock signal of a SDH (Synchronous Digital Hierarchy) signal or an Ethernet signal from an OTN (Optical Transport Network) signal, on the basis of a result of processing a jitter/wander component and a frequency change state on the basis of phase comparison data of the PLL means, wherein
the control means includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL means on the basis of the jitter/wander information and wherein
the Jitter/Wander Detector unit carries out a dithering process to multiply the phase comparison data by n(n is predetermined number not smaller than two), and to multiply the multiplied phase comparison data by 1/n after a FFT process.

21. A circuit, comprising:
a control means for controlling loop gain of a PLL means, which regenerates a clock signal of a SDH signal or an Ethernet signal from an OTN signal, on the basis of a result of processing a jitter/wander component and a frequency change state on the basis of phase comparison data of the PLL means, wherein
the control means includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL means on the basis of the jitter/wander information and the frequency change information, and wherein
the PLL Feed Forward Real-time Actuator unit calculates a cut-off frequency on the basis of the frequency change information, and on the basis of Pull-in/Hold-in Range and Memory Depth of DUT (Device Under Test) in the case that a frequency change exists, and sets amplifier gain, which is adaptive to the calculated cut-off frequency, to the PLL means, and controls the loop gain of the PLL means.

22. A circuit, comprising:
a control means for controlling loop gain of a PLL means, which regenerates a clock signal of a SDH signal or an Ethernet signal from an OTN signal, on the basis of a result of processing a jitter/wander component and a frequency change state on the basis of phase comparison data of the PLL means, wherein
the control means includes:
a Jitter/Wander Detector unit which processes the jitter/wander component and creates jitter/wander information;
a Frequency Change Slope Detector unit which processes the frequency change state and creates frequency change information; and
a PLL Feed Forward Real-time Actuator unit which controls the loop gain of the PLL means on the basis of the jitter/wander information and the frequency change information, and wherein
the PLL Feed Forward Real-time Actuator unit calculates a cut-off frequency on the basis of the frequency change information, and on the basis of the jitter/wander information in the case that a frequency change does not exist, and sets amplifier gain, which is adaptive to the
calculated cut-off frequency, to the PLL means, and controls the loop gain of the PLL means.

* * * * *